United States Patent
Willey et al.

(10) Patent No.: US 8,992,757 B2
(45) Date of Patent: Mar. 31, 2015

(54) THROUGH SILICON VIA FILLING USING AN ELECTROLYTE WITH A DUAL STATE INHIBITOR

(75) Inventors: Mark J. Willey, Portland, OR (US); Steven T. Mayer, Lake Oswego, OR (US)

(73) Assignee: Novellus Systems, Inc., Fremont, CA (US)

( * ) Notice: Subject to any disclaimer, the term of this patent is extended or adjusted under 35 U.S.C. 154(b) by 594 days.

(21) Appl. No.: 13/110,488

(22) Filed: May 18, 2011

(65) Prior Publication Data

US 2011/0284386 A1    Nov. 24, 2011

Related U.S. Application Data

(60) Provisional application No. 61/346,350, filed on May 19, 2010, provisional application No. 61/439,111, filed on Feb. 3, 2011.

(51) Int. Cl.
| | |
|---|---|
| *C25D 3/38* | (2006.01) |
| *H01L 21/768* | (2006.01) |
| *H01L 21/288* | (2006.01) |
| *C25D 7/12* | (2006.01) |
| *C25D 5/02* | (2006.01) |

(52) U.S. Cl.
CPC ............ *H01L 21/76898* (2013.01); *C25D 3/38* (2013.01); *H01L 21/2885* (2013.01); *C25D 7/123* (2013.01); *C25D 5/022* (2013.01)
USPC .............................. 205/296; 205/96; 205/118

(58) Field of Classification Search
USPC .................................... 205/118, 96, 291, 131
See application file for complete search history.

(56) References Cited

U.S. PATENT DOCUMENTS

| | | | |
|---|---|---|---|
| 6,126,798 A | 10/2000 | Reid et al. | 204/282 |
| 6,156,167 A | 12/2000 | Patton et al. | |
| 6,562,204 B1 | 5/2003 | Mayer et al. | 204/229.9 |
| 6,569,299 B1 | 5/2003 | Reid et al. | 204/282 |
| 6,800,187 B1 | 10/2004 | Reid et al. | |
| 7,303,992 B2 | 12/2007 | Paneccasio et al. | 438/687 |

(Continued)

OTHER PUBLICATIONS

Luhn, O., et al. "Filing of microvia with an aspect ratio of 5 by copper electrodeposition" Electrochemica Acta, 2009, 2504-2508.*

(Continued)

*Primary Examiner* — Keith Hendricks
*Assistant Examiner* — Stefanie S Wittenberg
(74) *Attorney, Agent, or Firm* — Weaver Austin Villeneuve & Sampson LLP

(57) ABSTRACT

A method for electrofilling large, high aspect ratio recessed features with copper without depositing substantial amounts of copper in the field region is provided. The method allows completely filling recessed features having aspect ratios of at least about 5:1 such as at least about 10:1, and widths of at least about 1 μm in a substantially void-free manner without depositing more than 5% of copper in the field region (relative to the thickness deposited in the recessed feature). The method involves contacting the substrate having one or more large, high aspect ratio recessed features (such as a TSVs) with an electrolyte comprising copper ions and an organic dual state inhibitor (DSI) configured for inhibiting copper deposition in the field region, and electrodepositing copper under potential-controlled conditions, where the potential is controlled not exceed the critical potential of the DSI.

29 Claims, 13 Drawing Sheets

(56) References Cited

U.S. PATENT DOCUMENTS

| | | | |
|---|---|---|---|
| 7,670,950 B2 | 3/2010 | Richardson et al. | 438/675 |
| 7,776,741 B2 | 8/2010 | Reid et al. | 438/678 |
| 2001/0015321 A1* | 8/2001 | Reid et al. | 205/103 |
| 2003/0070941 A1* | 4/2003 | Hirao | 205/775 |
| 2004/0065561 A1* | 4/2004 | Chalyt et al. | 205/775 |
| 2006/0141157 A1* | 6/2006 | Sekimoto et al. | 427/282 |
| 2006/0207886 A1* | 9/2006 | Isono et al. | 205/297 |
| 2006/0283710 A1* | 12/2006 | Cohen et al. | 205/118 |
| 2010/0200412 A1 | 8/2010 | Reid et al. | 205/123 |
| 2010/0320081 A1 | 12/2010 | Mayer et al. | 204/242 |
| 2010/0320609 A1 | 12/2010 | Mayer et al. | 257/773 |

OTHER PUBLICATIONS

Bozzini, B., et al. "An electrochemical and in situ SERS study of Cu electrodeposition from acidic sulphate solutions in the presence of . . . (Janus Green B)", Journal of Applied Electrochemistry, 2006, 36, 973-981.*

Kim, S-K., et al. "Cationic Surfactants for the Control of Overfill Bumps in Cu Superfilling" Journal of Electrochemical Society, 2006,153, 12, C826-C833.*

Kondo et al., "High Speed Through Silicon via Filling by Copper Electrodeposition," *Electrochemical and Solid State Letters*, 13 (5) D26-D28 (2010).

* cited by examiner

THROUGH SILICON VIA FILLING USING AN ELECTROLYTE WITH A DUAL STATE INHIBITOR

CROSS-REFERENCE TO RELATED APPLICATIONS

This application claims priority under 35 USC 119(e) from U.S. Provisional Patent Application No. 61/346,350 naming Willey and Mayer as inventors, titled "Through Silicon Via Filling Using an Electrolyte With a Dual State Inhibitor" filed May 19, 2010, and from U.S. Provisional Patent Application No. 61/439,111 naming Willey and Mayer as inventors, titled "Through Silicon Via Filling Using an Electrolyte With a Dual State Inhibitor" filed Feb. 3, 2011, which are herein incorporated by reference for all purposes.

FIELD OF THE INVENTION

The present invention relates generally to methods and apparatus for electrodepositing metals on substrates having recessed features and more particularly to methods and apparatus for electroplating copper for filling through silicon vias (TSVs).

BACKGROUND OF THE INVENTION

A TSV is a vertical electrical connection passing completely through a silicon wafer or die. TSV technology is important in creating 3D packages and 3D integrated circuits (IC). It provides interconnection of vertically aligned electronic devices through internal wiring that significantly reduces complexity and overall dimensions of a multi-chip electronic circuit.

A typical TSV process involves forming TSV holes and depositing conformal diffusion barrier and conductive seed layers, followed by filling of TSV holes with a metal. Copper is typically used as the conductive metal in TSV fill as it supports high current densities experienced at complex integration, such as 3D packages and 3D integrated circuits, and increased device speed. Furthermore, copper has good thermal conductivity and is available in a highly pure state.

TSV holes typically have high aspect ratios which makes void-free deposition of copper into such structures a challenging task. CVD deposition of copper requires complex and expensive precursors, while PVD deposition often results in voids and limited step coverage. Electroplating is a more common method of depositing copper into TSV structures; however, electroplating also presents a set of challenges because of the TSV's large size and high aspect ratio.

In a typical TSV electrofilling process, the substrate is negatively electrically biased and is contacted with a plating solution which includes copper sulfate as a source of copper ions, sulfuric acid for controlling conductivity, chloride ion and several organic additives known as suppressors, accelerators and levelers. However, the use of standard electrolytes and additives often results in very slow plating and in formation of voids during TSV filling. Further, filling of TSVs is usually accompanied by deposition of substantial amounts of copper in the field region, which later needs to be removed by chemical mechanical polishing (CMP) or other planarization methods. Further, conformal filling which includes deposition of substantial amounts of copper on the TSV sidewalls, can result in seam voids.

Several approaches have been proposed for bottom-up (rather than conformal) filling of TSVs. U.S. Pat. No. 7,670,950 issued to Richardson et al., describes filling TSVs using an electrolyte, which includes a polymeric organic additive (e.g., a vinyl pyridine based polymer) which promotes faster copper deposition at the via bottom than at the via opening. Richardson describes depositing copper onto TSV substrate while controlling current density applied to the substrate and achieves filling times of about 110 minutes for filling 90-micron deep TSVs.

Another approach is described in an article titled "High Speed Through Silicon Via Filling by Copper Electrodeposition" (*Electrochemical and Solid-State Letters*, 13(5) D26-D28 (2010)) by Kondo et al., where TSV filling includes two components: (a) printing of copper deposition inhibitor (octadecanthiol) on top surface of the substrate prior to deposition to inhibit deposition of copper in the field, and (b) adding a polymeric organic additive (sulfonated diallyl dimethyl ammonium chloride copolymer) to the plating bath. Electroplating also involved purging the plating bath with oxygen before each electrodeposition to enrich the plating solution with oxygen. Filling time of 37 minutes was achieved for a 70-micron deep TSV with this method. However, this method requires two distinct steps which employ different chemical compounds, and is, therefore, costly. Additionally, in a two step process, the additional variable of residence time of the substrate between these processes, can cause additional variability in the product, which is undesirable.

While these methods address some of the problems associated with TSV filling, both faster filling methods, and methods with more robust control over the quality of the filling process, are desired.

SUMMARY

In one aspect, methods for filling large high aspect ratio features (such as TSVs) with improved speed and control are provided. In some embodiments, electroplating conditions are controlled such that a recessed feature with an aspect ratio of at least about 5:1 and a width at recess opening of at least about 1 µm is filled with metal (such as copper) in a substantially void-free manner, such that, after the filling is completed, less than about 5% of metal is deposited in the field region (relative to the thickness of copper layer deposited within the completely filled feature). The recessed features can be filled with average electrodeposition rates of at least about 1 microns/minute, such as at least about 2 microns/minute (e.g., between about 1-3 microns/minute). Further, in some aspects, provided methods can fill the recessed features with high-purity metal, such that organic additives from electroplating solution are not substantially incorporated into the electrodeposited metal. For example, substantially void-free structures are obtained, after the electrofilled substrates are annealed at high temperature. Advantageously, provided methods can be carried out in one plating bath, without the need to passivate the field region in a separate step.

In the provided methods, electrodeposition in the field region of the substrate is minimized in a controlled manner, by selecting a set of electroplating conditions, which are specifically tailored for a particular type of electroplating bath that uses a dual state inhibitor (DSI) organic additive. DSI additives are organic compounds, which can effectively inhibit deposition of metal over a large range of potential values below a DSI critical potential, resulting in little or no deposition. However, after the critical potential is exceeded, the DSI no longer inhibits electrodeposition, allowing for deposition of metal at fast rates. The presence of DSI additive in the plating bath under a pre-selected set of conditions, allows for fast and efficient bottom-up deposition within the recessed features, without depositing large amounts of metal in the field region.

The electrochemical behavior of DSI is distinct from the behaviors of other electroplating additives, generally known as accelerators, suppressors, and levelers, although some levelers may function as DSIs under a selected set of conditions. While DSI additives can be used in combination with conventional suppressors, accelerators, and/or levelers, these other organic additives are not required for DSI function. In some embodiments, a DSI compound (i.e. one or more compounds having DSI properties) is the only electrochemically active organic molecule that is present in the electroplating bath.

In one aspect, a method of electrochemically filling a large, high-aspect ratio recessed feature (such as a TSV having an aspect ratio of at least about 5:1, and a width at the opening of at least about 1 micron) comprises: (a) providing a substrate having a recessed feature (e.g., an array of recessed features) to an electroplating apparatus; and (b) electroplating copper in the recessed feature by contacting the substrate with an electroplating solution comprising (i) copper ions and (ii) an organic DSI compound configured for inhibiting copper deposition in the field region, while electrically biasing the substrate under potential-controlled conditions. The potential (referring to the potential of the metal substrate) is controlled, such that a critical potential of the DSI compound is not exceeded in the field region of the substrate under the used set of plating conditions. As a result, after filling the feature, the ratio of the copper layer thickness deposited on the field to the metal layer thickness deposited in the feature is not greater than about 0.05. Recessed features with aspect ratios of 15:1 and greater can be filled by this method.

Without wishing to be bound by a particular theory of operation, it is believed that in the beginning of plating, there is a gradient of DSI additive concentration between the field region and the recessed feature bottom. The concentration of the DSI is higher in the field region than within the feature in the initial period of time, after the substrate is contacted with the plating solution. Due to the concentration gradient, DSI initially effectively inhibits plating in the field region, but not at the bottom of the recessed feature. After the plating within the recessed feature has gained momentum, DSI compound would not be able to suppress the plating within the feature, even after DSI molecules have diffused into the recessed feature and the field/in-feature DSI concentration gradient is removed. In other words, due to the initial concentration variation in the feature the critical potential is much less within the feature and therefore the feature starts filling while the higher critical potential in the field is not reached and therefore no plating occurs there. This is to say that plating occurs in the feature due to a concentration gradient of the DSI additive.

The potential can be controlled by using a reference electrode positioned in the proximity of the substrate. In some embodiments, the reference electrode comprises an unpolarized metal, which is the same metal that is being plated. For example, if a TSV is being filled with copper, a reference electrode can be an unpolarized piece of copper immersed into a reference electrode solution, and residing in a reference electrode compartment, connected to the main plating bath by a capillary filled with electrolyte or by a connector with a cation-permeable membrane. The reference electrode solution typically has an identical composition to the plating solution (e.g., contains copper ions and an acid at the same concentrations as those used in the plating solution), but does not include organic additives. The electrolyte-filled capillary or the cation-permeable membrane can block the transfer of substantial amounts of organic additives from the main plating bath to the reference electrode solution. In some embodiments, the reference electrode chamber is periodically flushed with an additive-free electrolyte to remove trace amounts of organic additives. The reason for having an organic additive free reference electrode chamber is to maintain a stable reference potential. If organics bleed into the chamber then the reference electrode surface potential could change causing variability from wafer to wafer on the applied potential.

In other embodiments, the electrical biasing and controlling of the potential can comprise: (i) determining a current waveform imposed on the plating cell that creates equivalent to potential-controlled conditions, and (ii) applying this current waveform to the substrate during electroplating.

During potential-controlled electroplating, the potential is maintained such that it does not exceed the critical potential of the DSI compound for the given set of plating conditions (e.g., for selected copper, acid, DSI concentrations, and at a given substrate rotation rate). If the critical potential is exceeded, the DSI will stop inhibiting the deposition in the field region which will result in high field deposition thickness and/or formation of voids within the electrofilled features. Further, preferably the potential is controlled such that it does not drop lower than 150 mV from the critical potential. If the potential drops to lower values, the electrodeposition within the features may stall or become too slow. While not being bound by a particular theory, it is believed that the plating momentum in the feature must be created initially so that when the concentration of the DSI becomes that of the field within the feature, the current is high enough to repel the incoming DSI. Within these general guidelines, the potential can be modulated in a variety of ways. In some embodiments, the potential is kept constant throughout electrodeposition after a brief ramping period. In other embodiments, the potential can be increased continuously or in a step-function manner. In other embodiments, the potential can be pulsed.

In some embodiments the electroplating conditions are selected such that the dual state inhibitor suppresses the current in the field region to less than about 2 mA/cm$^2$. Further, it is preferable that the critical potential of the dual state inhibitor is at least about −0.15 V versus the open circuit potential and that at the critical potential the current increase is at least 0.1 mA/cm$^2$ per 1 mV.

The plating can be performed at a temperature range of between about 20 and 60 degrees C., wherein the substrate is rotated at between about 5-120 rpm during plating. Preferably, the substrate is electrically biased within about 1 second after it is contacted with the plating solution. In some embodiments, it is preferable to reduce the rotation speed of the substrate during plating. In some embodiments, the endpoint of plating is determined by the current response from the substrate.

In general, the electroplating solution comprising a DSI molecule can have a variety of compositions. In some embodiments, the composition is tailored such as to maximize dual-state properties of the additives and to obtain minimum ratio between the field an in-feature thicknesses.

In some embodiments, the plating solution comprises copper ions, typically at a concentration of at least about 10 g/L. In some embodiments, plating solutions with high copper concentration, such as at least about 40 g/L, are preferred in order to maximize plating rates. While solutions with relatively low copper ion concentration (e.g., from about 10 g/L to about 40 g/L) are used in some embodiments, in many implementations the concentration of copper ions of between about 40-200 g/L, such as between about 60-200 g/L, is used. A variety of soluble copper salts can be used as copper ion sources, including copper sulfate, copper alkylsulfonates (e.g., copper methanesulfonate, and copper ethanesulfonate) and mixtures thereof.

The concentration of the DSI compound in the plating solution can vary depending on the nature of the DSI and depending on the plating conditions. For example, the DSI organic additive can have a concentration in a range of about 1-300 ppm, such as about 15-50 ppm. In some embodiments, the plating solution may contain more than one DSI additive.

While electroplating can be performed in an absence of acid, in many embodiments the plating solution contains an acid (e.g., sulfuric acid, alkanesulfonic acid or mixtures thereof) to increase the conductivity of the plating solution and to improve the plating rate and within die uniformity. For example, plating solutions containing sulfuric acid and/or methanesulfonic acid at a concentration of at least about 1 g/L, more preferably at least about 10 g/L, such as at least about 40 g/L are used in some embodiments. High acid concentration (0.4 M or more) is preferred in some embodiments, because higher plating rates can be achieved at these concentrations. In some embodiments, sulfuric acid/or methanesulfonic acid concentrations of about 100 g/l are used and this has been shown to increase plating rates as well as within die uniformity.

The plating solution further may contain one or more of electrochemically active additives, selected from the group consisting of a halide (e.g., chloride or bromide), an accelerator, a suppressor, and a leveler. However, in many embodiments, it may be preferable to conduct plating without one or more of these additives. For example, in some embodiments the electroplating solution is substantially free of chloride. In some embodiments, the plating solution contains a DSI additive (i.e. one or more DSI additives) as the only organic electrochemically active additive. In some embodiments, the electroplating bath comprises a DSI additive and a suppressor, a DSI additive and an accelerator, or a DSI additive together with an accelerator and a suppressor. For example in some embodiments, the electroplating solution comprises DSI and an electroplating accelerator, selected from the group consisting of 3-mercapto-1-propanesulfonic acid, bis-(3-sodiumsulfopropyldisulfide) (SPS), and N,N-dimethyldithiocarbamyl propylsulfonate (DPS). In some embodiments the electroplating solution comprises DSI and an electroplating suppressor, selected from the group consisting of PEG and PEO.

A DSI organic additive, in some embodiments is a non-polymeric molecule. In some implementations, non-polymeric quarternary ammonium salts having alkyl or aralkyl substituents are used. In some embodiments, one or more alkyl or aralkyl substituents has seven carbon atoms or more. Examples of such DSI compounds include thonzonium bromide and benzyldimethylhexadecylammonium chloride (BDHAC). In other embodiments, polymeric DSIs may be used. In some embodiments the DSI compound is selected from the group consisting of a benzalkonium salt, a thonzonium salt, a dodecyltrimethylammonium salt, and benzyldimethylhexadecylammonium salt.

An aspect of the invention provides a method of filling a recessed feature (e.g., an array of TSVs) on a substrate, where the recessed feature has an aspect ratio of at least about 5:1 and a width at opening of at least about 1 µm, where the method comprises: (a) providing a substrate having such recessed feature to electroplating apparatus; (b) contacting the substrate with an electroplating solution comprising (i) copper ions and (ii) an organic DSI additive configured for inhibiting electroplating in the field region, where the DSI molecule is a non-polymeric quarternary ammonium salt; and (c) electroplating copper with the electroplating solution to completely fill the recessed feature, where the ratio of the copper layer thickness deposited in the field to the thickness of copper layer deposited within the feature, after the feature was completely filled, is not greater than about 0.05.

In a separate aspect, the use of DSI molecule during plating is combined with a special method for pre-wetting the substrate. In some embodiments, the substrate containing a recessed feature (e.g., an array of TSVs), where the recessed feature has an aspect ratio of at least about 5:1 and a width at opening of at least about 1 µm, is pre-wetted by contacting the substrate with a degassed pre-wetting solution under a subatmospheric pressure. In some embodiments, the pre-wetting fluid is free of electrochemically active organic additives. In some embodiments, the pre-wetting solution is degassed water. In other embodiments, the pre-wetting fluid is a degassed solution of copper salt (e.g., copper sulfate and/or copper alkanesulfonate), where copper ion concentration is preferably the same as or higher than the concentration of copper ions in the plating solution. The described pre-wetting method forms a bubble-free wetting layer within the recessed feature, and, thus, works in synergy with the plating step, resulting in void-free filling of recessed features. After the pre-wetting operation, the substrate is electroplated with copper using an electrolyte containing a DSI additive, according to any of the methods, described herein. In some embodiments, the pre-wetting is performed in a pre-wetting chamber configured for generating subatmospheric pressure, and is later transferred to the electroplating apparatus for plating.

In another aspect an apparatus for electroplating is provided. The apparatus includes a vessel configured for holding an electroplating solution, a substrate holder, which, in some embodiments, is configured for rotating the substrate at a desired speed, an anode, and a controller configured for providing program instructions for performing any of the plating methods provided herein.

In some embodiments, the apparatus further includes a pre-wetting chamber, configured for treating the substrate with a degassed pre-wetting fluid under subatmospheric pressure, and a controller further comprises program instructions for pre-wetting the substrate, according to pre-wetting methods provided herein.

In some embodiments, a system is provided, where the system comprises an electroplating apparatus and a stepper.

In another aspect, an electroplating solution configured for filling high aspect ratio recessed features on a substrate, with minimal deposition in the field region is provided. The aqueous solution comprises, in one embodiment: (a) copper ions; and (b) an organic non-polymeric DSI additive, configured for inhibiting deposition of copper in the field region, where the DSI additive is a quarternary ammonium salt comprising one or more alkyl or aralkyl N-substituents. In some embodiments the one or more of the alkyl or aralkyl substituents has at least seven carbon atoms. Suitable substituents include without limitation, benzyl, heptyl, octyl, dodecyl, etc. In some embodiments, the salts are chlorides or bromides. The electroplating solution, may further comprise an acid (e.g., sulfuric acid and/or alkanesulfonic acid), and, optionally, other components, as described herein with reference to any of the electroplating methods.

In another aspect, a method as any of the methods described above further comprising the steps of: (i) applying photoresist to the substrate; (ii) exposing the photoresist to light; (iii) patterning the resist and transferring the pattern to the substrate; and (iv) selectively removing the photoresist from the substrate. For example, patterning may be performed to define large recessed features on the substrate prior to electroplating.

In another aspect, a non-transitory computer machine-readable medium comprising program instructions is provided. The program instructions for control of an electroplating apparatus comprise code for performing any of the method described above.

These and other features and advantages of the present invention will be described in more detail with reference to the figures and associated description that follows.

DETAILED DESCRIPTION OF A PREFERRED EMBODIMENT

Figure 1A:
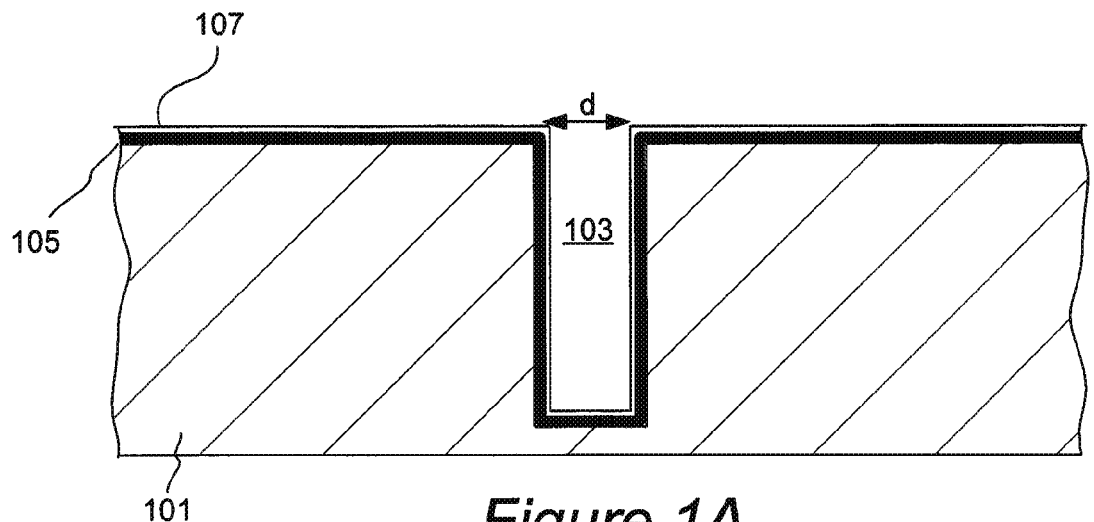
FIGS. 1A-1C present schematic representations of semiconductor device cross-sections at various stages of TSV processing.

In the following description, the invention is presented in terms of certain specific configurations and processes to help explain how it may be practiced. The invention is not limited to these specific embodiments. Examples of specific embodiments of the invention are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the scope and equivalents of the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

In this disclosure various terms are used to describe a semiconductor work piece. For example, "wafer" and "substrate" are used interchangeably. The process of depositing, or plating, metal onto a conductive surface via an electrochemical reaction is referred to generally as electroplating or electrofilling. Copper-containing metal in this application is referred to as "copper" which includes without limitation, pure copper metal, copper alloys with other metals, and copper metal impregnated with non-metallic species, such as with organic and inorganic compounds used during electrofill operations (e.g., levelers, accelerators, suppressors, surface-active agents, etc.).

Concentrations of copper in g/L given in this application refer to $Cu^{2+}$ ion concentrations only (rather than to concentrations of salts including anion).

Many of the potential values, discussed, herein are negative. In order to simplify comparison between these values, reference will be made to their absolute numbers. For example, if a DSI compound has a critical potential of −0.2V versus open circuit potential (OCP), the values of −0.2-0 vs. OCP will be referred to as values that "do not exceed the critical potential". Similarly, the phrase that "the potential is not allowed to drop to less than 150 mV relative to the critical potential, means that the potential is not allowed to become more positive than −0.05 V vs. OCP (for the −0.2 critical potential). Similarly, some of the current densities discussed herein, are negative, according to conventional usage. Negative currents refer to currents that are derived from electroplating (depositing) metal. Positive currents refer to stripping metal (oxidizing metal on the surface. To simplify comparison between currents, reference will be made to their absolute values.

While electrofilling processes will be primarily described making reference to copper plating, it is understood that the methods provided herein and associated apparatus configurations can be used to perform plating of other metals and alloys, such as Au, Ag, Ni, Ru, Pd, Sn, Pb/Sn alloy, etc. When metals other than copper are plated, the plating electrolytes will include a source of required metal ions and a DSI additive configured for inhibiting deposition of metal in the field region. Further, the electrolytes will also include an acid, in many embodiments, in order to increase electrolyte conductivity.

While provided methods are particularly advantageous for filling TSVs, these methods can be used for depositing metals into other high aspect ratio recessed features on various substrates. The methods are particularly useful for filling recessed features having aspect ratios of 5:1 and greater, such as 10:1 and greater, and even 20:1 and greater. The methods can be used to fill relatively large features which have widths at opening of about 1 μm or greater, such as about 5 μm or greater, and depths of about 20 μm or greater, such as 50 μm or greater, and 100 μm or greater. Such recessed features are difficult to fill using conventional techniques, due to long filling times, and due to formation of voids within the features, as bottom-up filling regimes for such high-aspect ratio features are difficult to control using conventional techniques.

Embodiments of present invention provide methods and apparatus for fast bottom-up filling of relatively large high aspect ratio features, and arrays of features on the substrate. Filling can be accomplished in a substantially void-free manner, and with minimized deposition of metal in the field region. In some embodiments, recessed features having aspect ratios of between about 5:1 to about 40:1 (e.g., 10:1-30:1) and having widths of between about 1-20 μm (e.g., 5-15 μm) are filled in a substantially void-free manner with average plating rates of at least about 1 μm/min, such as at least about 2 μm/min, e.g., between about 1-3 μm/min. Average plating rate is defined as the total time required to fill the feature divided by the depth of the feature. For example, features having depths of between about 60-100 μm can be filled over 24-40 minutes.

Due to high level of control over the bottom-up fill, the filling of features is accompanied by minimal deposition of metal in the field region. Typically, after the features are completely filled, the thickness of metal in the field region is no greater than about 5% of the metal thickness deposited in-feature. In many embodiments, the thickness of metal in the field region is no greater than about 1% (e.g., less than about 0.5%) of the metal thickness deposited in-feature. In some embodiments, after the features are filled, there is essentially no metal deposited in the field region.

In some embodiments, advantageously, the filling of the features does not involve substantial incorporation of organic additives into the filled metals. Specifically, in some embodiments, the DSI organic additive is a non-polymeric quarternary ammonium salt, which inhibits deposition in the field region without being incorporated into the metal-filled features during plating. Examples of suitable DSI compounds that are not incorporated into the plated layer include non-polymeric tetraalkylammonium chlorides or bromides, which are N-substituted with one or more alkyl or aralkyl substituents having at least 7 carbon atoms. Specific examples include thonzonium bromide and BDHAC.

The use of non-polymeric DSI molecules which do not become incorporated into the plated metal layer, is a significant feature of provided processes, in accordance with some embodiments. This is because incorporation of organic additives can lead to formation of voids in the filled feature, after the obtained structures are annealed at high temperatures. Accordingly, provided methods give rise to structures that are substantially void-free post-anneal.

TSV Processing

Figure 1B:
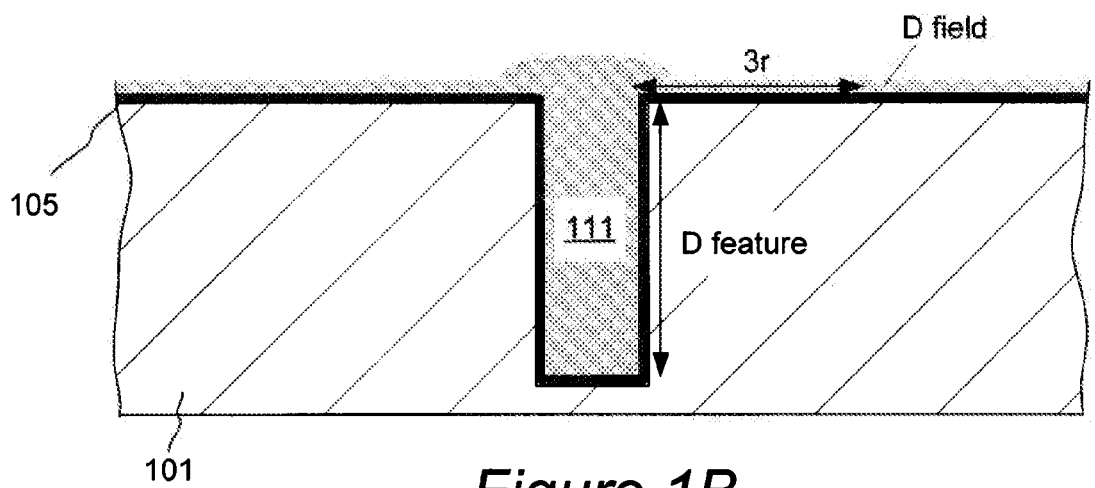
Figure 1C:
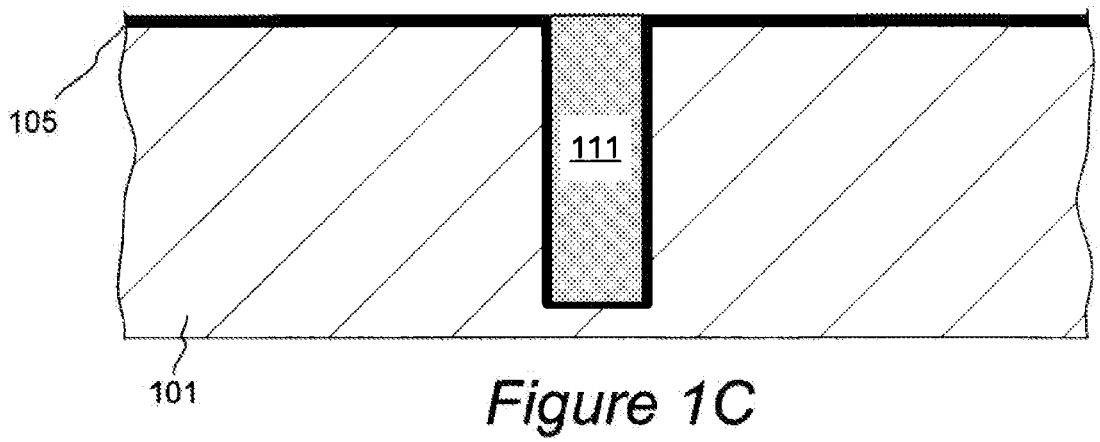

The integration of provided plating methods into damascene feature processing, will be now illustrated making reference to FIGS. 1A-1C, which show cross-sectional views of a substrate containing a through-silicon via (TSV) during various stages of processing.

A TSV is a vertical electrical connection passing completely through a silicon wafer or a die. TSV technology may be used in 3D packages and 3D integrated circuits, sometimes collectively referred to as 3D stacking. For example, a 3D package may contain two or more integrated circuits (ICs) stacked vertically so that they occupy less space and have shorter communication distances between the various devices than in a 2D layout. Traditionally, stacked ICs are wired together along their edges, but such wiring design can still lead to significant signal transmission time delays, as well as to increases in the stack's dimensions, and usually requires additional redistribution layers to route signals to the periphery of the various ICs. Significantly greater numbers of shorter length, dense interconnections can be made by wiring the IC's directly though the silicon substrate, between each of the vertically stacked ICs. TSVs provide connections through the body of the ICs substrate leading to smaller compact stacks with greatly increased communication bandwidth. Similarly, a 3D single IC may be built by stacking several silicon wafers and interconnecting them vertically through each of the substrates. Such stacks behave as a single device and can have shorter critical electrical paths leading to faster operation. This approach is in many aspects technically superior to traditional peripheral wire-bonding interconnect methodology.

Electronic circuits using TSVs may be bonded in several ways. One method is "wafer-to-wafer", where two or more semiconductor wafers having circuitry are aligned, bonded, and diced into 3D ICs. Each wafer may be thinned before or after bonding. The thinning process includes removal of the wafer material to expose the bottom part of the TSV. TSVs may be formed into the wafers either before bonding or created in the stack after bonding and may pass through the silicon substrates between active layers and an external bond pad. Another method is "die-to-wafer" where only one wafer is diced and then the singled dies are aligned and bonded onto die sites of the second wafer. The third method is "die-to-die" where multiple dies are aligned and bonded. Similar to the first method, thinning and connections may be built at any stage in the last two methods. The integration of the high rate plating process into through-silicon via processing is not significantly affected by the sequence in which the through-silicon via is processed.

FIGS. 1A-1C illustrate processing of a TSV prior to wafer thinning, that is, the TSV at these processing stages does not reach all the way through the silicon wafer. A TSV may be used with both dies and wafers, generally referred here as semiconductor substrate 101. Examples of the material suitable for a semiconductor substrate 101 include, but are not limited to silicon, silicon on insulator, silicon on sapphire, and gallium arsenide. In some embodiments, the semiconductor substrate includes a layer of dielectric, such as silicon oxide based dielectric. In other cases the substrate may be more similar to a single level or multilevel circuit board, and can be made of a ceramic or embedded epoxy. Further in some embodiments the substrate may include circuitry or active transistor devices. These features are not shown to preserve clarity.

In a first cross-sectional view shown in FIG. 1A, a TSV hole 103 having width d at the opening, is formed in the semiconductor substrate 101. The depth of the TSV hole 103 must be sufficient to allow for a complete cutting through layer 101 during the subsequent thinning operation. Typically, TSV holes may be between about 5 to 400 microns deep (often between about 50 to 150 microns deep), however the present invention may be practiced with the TSV holes of other sizes as well. The diameter of TSV holes may vary between about 1 to 100 microns (more typically between about 5 to 25 microns). The TSV holes typically have a high aspect ratio, which is defined as the ratio of the TSV hole depth to the TSV hole diameter (usually at the opening). In certain embodiments, the TSV hole aspect ratio may vary between about 2:1 to 40:1 (such as between about 5:1 and 20:1). TSV size also depends on which stage of the overall 3D stacking process includes TSV formation. A TSV can be formed before ("via first") or after ("via last") stacking. In the "via-first" configuration, the TSV may be formed before or after creating CMOS structures. In the "via-last" configuration, the TSV may be formed before or after bonding. Moreover, in both configurations, thinning may be performed before or after bonding. The invention may be practiced with any TSV sizes or forming configurations described herein. Table 1 summarizes typical TSV dimensions (in micrometers) for various TSV configurations. While FIGS. 1A-1C and the corresponding description generally pertains to the configuration where a TSV is formed before stacking and CMOS processing and thinning are performed before bonding ("via-first"+before CMOS+thinning before bonding), this invention can be readily applied to other configurations.

TABLE 1

|  |  | "Via-First" | | "Via-Last" | |
| --- | --- | --- | --- | --- | --- |
|  |  | Before CMOS | After CMOS | Before Bonding | After Bonding |
| Diameter | Thinning Before | 2-5 | 5-20 | 20-50 | 5-50 |
| Depth | Bonding | 30-50 | 40-150 | 50-400 | 30-150 |
| Diameter | Thinning After | 1-5 | 1-5 | 3-5 | 3-5 |
| Depth | Bonding | 5-25 | 5-25 | 5-25 | 5-25 |

TSV holes may be formed using standard photolithographic and etching methods. Returning to FIG. 1A, the TSV hole 103 may be formed through a top surface, which may be an active surface of a wafer or a die and may include electronic devices. Alternatively, the TSV hole may be formed through the back surface of a wafer or a die where the circuitry is not present.

The cross-section in FIG. 1A shows that a layer of diffusion barrier material 105 resides over the substrate 101, and conformally lines the substrate both in the field and within the TSV 103. Suitable materials for the diffusion barrier layer 105 include tantalum, tantalum nitride, tungsten, titanium, ruthenium, titanium nitride, and alloyed and layered combinations of these and other materials. In a typical embodiment, the diffusion barrier layer 105 is formed by a PVD process, although other techniques such as chemical vapor deposition (CVD), electroless deposition, or atomic layer deposition (ALD) may be employed. The seed layer 107 is then deposited to provide a uniform conductive surface for current passage during an electroplating operation. As with the barrier layer deposition, a PVD method may be employed for this operation, although other processes such as electroless or electrolytic deposition may be employed as well. Suitable seed layer materials include metals such as copper, copper alloys, cobalt, nickel, ruthenium, etc. or combined layers such as Co/Cu or Ru/Cu. In some embodiments the seed layer can also perform a function of a diffusion barrier. In these embodiments, it may not be necessary to employ a separate diffusion barrier layer 105. Referring again to FIG. 1A, it can be seen that seed layer 107 conformally lines the substrate and resides on top of the diffusion barrier layer 105 both in the field and within the TSV.

Next, a copper layer 111 is deposited by electroplating methods provided herein onto the seed layer 107 (the seed layer is not shown in FIG. 1B to preserve clarity) to completely fill the TSV hole 111, as shown in FIG. 1B. During plating, current is generated through the seed layer 103 causing copper ions to flow towards and deposit on the seed layer. Typically, after electrodeposition with DSI additive is completed, a copper overburden layer formed over the field region is very thin or non-existent. In some embodiments, after the features are filled, a small protrusion will be formed directly over the filled feature and, to a limited degree, laterally around the feature, forming the mushroom structure shown in FIG. 1B. However, in the field region (typically, at least three feature radii away from the feature in the lateral direction, as illustrated in FIG. 1B), the thickness of the deposited copper layer is very small. As it was previously mentioned, the ratio of field thickness to in-feature thickness (D field/D feature) after the feature is completely filled is typically less than about 0.05, such as less than about 0.01. In some embodiments, there is no metal deposited in the field region at all.

U.S. patent application Ser. No. 12/193,644, filed on Aug. 18, 2008, titled "Process for Through Silicon Via Filling" naming J. Reid et al. as inventors describes a process where overburden is minimized with the use of various additives. The conditions disclosed in this application can be used in conjunction with methods disclosed herein (e.g., potential-controlled plating, pre-wetting treatment, and with specific DSI additives described herein). U.S. patent application Ser. No. 12/193,644 is herein incorporated by reference in its entirety and for all purposes.

After electrodeposition of copper is completed, the copper overburden is removed in a post electroplating process, which may include wet chemical etching, chemical mechanical polishing (CMP), electroplanarization, and various combinations of these methods.

The next cross-section shown in FIG. 1C illustrates the substrate 101 after post-electroplating processes to remove copper overburden are completed. As shown, the overburden is removed and the diffusion barrier layer 105 is exposed over the field region. In subsequent operations (not shown), the diffusion barrier material is removed from the field region (e.g., by CMP) and the substrate is thinned at the TSV bottom, to allow the TSV go entirely through the substrate.

Further, at some point after the features are filled with metal (before or after removal of overburden) the substrate may be annealed by exposing the substrate to a temperature of between about 150-450° C. to improve the grain size of deposited copper.

It is understood that the process flow depicted in FIGS. 1A-1C is one illustration of a possible process that involves TSV formation. In other embodiments, different processing methods may be used. For example, in an alternative processing method, a layer of photoresist may be residing over the seed layer 107 on the field (but not within the feature) prior to and during electroplating.

Generally, however, it is an advantageous feature of provided method that no special treatment is required to passivate the field region prior to electrodeposition. In the provided method, the deposition of metal in the field is inhibited in situ, by the DSI compound in the plating solution. Unlike in the method disclosed by Kondo et al., no surface pre-treatment of the field region needs to be performed to inhibit the deposition in the field. It is understood, however, that in alternative embodiments, the use of DSI compound may be combined with various field-inhibiting pre-treatments.

The apparatus and processes described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper. In some embodiments, patterning is performed to define large recessed features prior to electroplating process.

Dual State Inhibitor (DSI) Characteristics

The methods provided herein make use of DSI additives to inhibit deposition of copper in the field region, while allowing for fast bottom-up filling in the recessed features. DSI additives are organic compounds, which have electrochemical characteristics that are distinct from those of generally known additives, such as accelerators, suppressors and levelers. Essentially, DSI additives can act as switches, which do not allow for substantial metal deposition until a certain potential (DSI critical potential) is reached. After the critical potential is exceeded, the DSI essentially stops inhibiting the deposition, and fast electroplating ensues. Due to a difference in microenvironments in the field region and at the bottom of the recessed feature, the plating conditions can be controlled, such that the DSI is in its "on" state on the field, where it inhibits the copper deposition, and is in its "off" state at the bottom of the recessed feature, where the deposition is not inhibited. Without being bound by a specific theory, it is believed to occur due to a differential in concentration of the DSI at the beginning of plating which causes a differential in the critical potential.

It is also noted that DSI behavior is specific to a particular set of conditions (e.g., copper concentration, acid concentration, DSI concentration, and substrate rotation rate). For example, one compound may have DSI behavior under a certain set of conditions, but may not be effective as a switch under a different set of conditions.

Figure 2A:
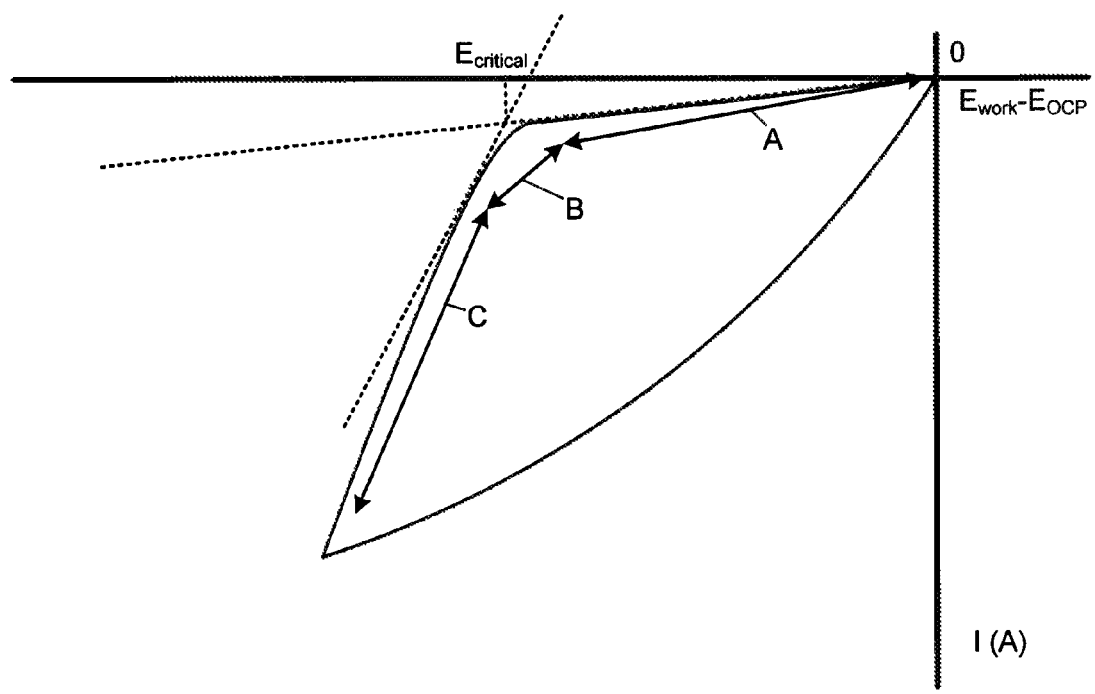
FIG. 2A presents a graphical representation of a typical cyclic voltammetry plot for a compound showing a DSI behavior.

DSI characteristics are illustrated in FIG. 2A, which shows cyclic voltammetry (CV) curve for an electrolyte containing copper ions, sulfuric acid and a DSI compound, under conditions in which the DSI is active as a switch. The x-axis shows potential applied to the substrate (as a difference between the applied potential and the open circuit potential (OCP)). The y-axis shows the recorded current. It can be seen that the obtained CV curve contains three main regions. In the first region, A, the current is minimal and does not substantially change over a large range of applied potential. In the second region B, a transition occurs, and the current becomes responsive to the change in the applied potential. Finally, in the third region, C, the current rapidly increases with the increase in potential. The change of behavior occurs after the critical potential (E critical) is exceeded. The critical potential can be determined graphically, for example by providing a tangent to region A at a point where the current is least responsive to potential change, and a tangent to region B at a point where the current is most responsive to the potential change. The intersection of these tangents projected onto the x-axis will provide the critical potential for a given system.

The significant features of DSI behavior are as follows: (a) presence of a first relatively large potential span (preferably at least about 0.1 V, such as at least about 0.15 V, e.g., at least about 0.2 V versus the OCP), which corresponds to a very low current (preferably less than about 2 mA/cm$^2$, such as less than about 1 mA/cm$^2$); and (b) presence of a second region, where current is increased at a fast rate with potential change (preferably at least about 0.1 mA/cm$^2$ per 1 mV, such as at least about 0.2 mA/cm$^2$ per 1 mV).

Figure 2B:
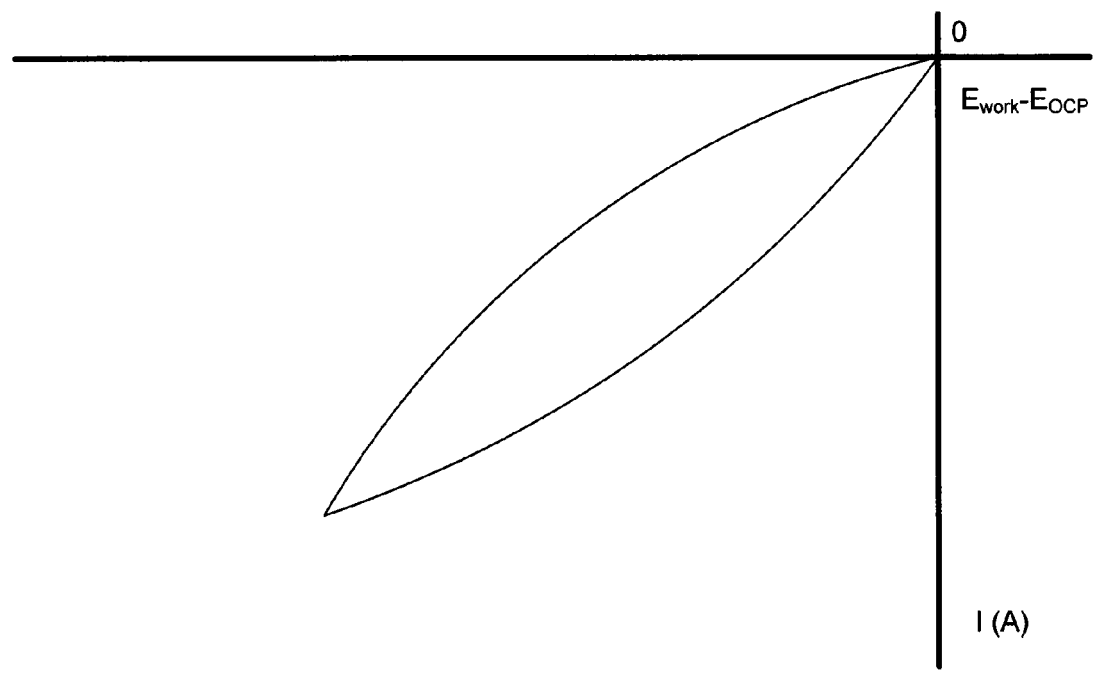
FIG. 2B presents a graphical representation of a typical cyclic voltammetry plot for a compound showing a non-DSI behavior.

For comparison, FIG. 2B presents a CV diagram for an electrolyte which does not contain a DSI (or in which the DSI is inactive). It can be seen that in this system, the current increases monotonously with the increase in applied potential. Such system will not be suitable for inhibiting deposition in the field region or for efficient bottom-up plating.

As it was previously mentioned, DSI properties are typically exhibited by a DSI compound under a specific set of conditions. The parameters that influence DSI behavior include DSI compound concentration, concentrations of other electrolyte components (e.g., concentration of copper ions, concentration of acid, concentration of a halide additive, such as chloride or bromide concentration), rotation rate of the substrate during plating, and temperature of the plating solution. For example, DSI behavior can be obtained for some electrolytes, after the concentration of DSI compound exceeds a certain value. For some DSI-containing electrolytes, DSI behavior may be dependent on the presence of chloride (e.g., DSI behavior may be shut off by high chloride concentration), or acid (e.g., DSI behavior may be shut off by high acid concentration). In other DSI-containing electrolytes, the DSI behavior may be maintained over a large range of chloride concentrations and/or acid concentrations. The specific electroplating conditions, suitable for each particular DSI compound can be easily determined by running CV experiments with varying process parameters, to determine a process window (e.g., a preferred electrolyte composition), which is associated with DSI electrochemical behavior. After a suitable range of parameters associated with DSI behavior, has been determined, these conditions are selected for the filling of recessed features on the substrate.

Chemically, organic DSI molecules can have a variety of structures, and generally can be polymeric or non-polymeric. In some embodiments, non-polymeric DSI molecules are preferred because they do not tend to be incorporated into the electroplated copper film, and, therefore, can provide copper layers of high purity. In some embodiments, the DSI molecules are ammonium salts (e.g., alkylammonium chlorides or bromides, including substituted and unsubstituted monoalkyl, dialkyl, trialkyl and tetraalkylammonium chlorides and bromides). Quartenary tetraalkylammonium chlorides and bromides are preferred in some embodiments. One or more alkyl substituents may be aralkyls (e.g. benzyl, pyridylmethyl, etc.). In some embodiments one or more alkyl and/or aralkyl substituents have at least seven carbon atoms. Typically the molecular weight of the cationic portion of the salt is less than about 1,000 g/mol, such as less than about 800, e.g., less than about 600. In some embodiments, the quartenized nitrogen atom is not part of an aromatic ring. In other embodiments, quartenized nitrogen may be included in the aromatic system (e.g., quartenized pyridinium salts).

Specific examples of non-polymeric tetraalkylammonium salts, include, without limitation, benzalkonium chloride, dodecyltrimethylammonium bromide, benzethonium chloride, methylbenzethonium chloride, cetalkonium chloride, cetylpyridinium chloride, cetrimonium, cetrimide, dofanium chloride, tetraethylammonium bromide, didecyldimethylammonium chloride, domiphen bromide. In some embodiments, thonzonium bromide (available from Sigma Aldrich, CAS Number 553-08-2) and BDHAC (available from Sigma Aldrich, CAS Number 122-18-9) are used.

In some embodiments, DSI molecules can be polymers. For example, polymers containing quartenized nitrogen may be used as DSIs. Examples of polymeric DSIs include polymeric derivatives of vinyl pyridine, where the polymers comprise quartenized pyridinium ion, such as DVF 200 Additive C (available from Enthone Inc., West Haven, Conn.).

Electrolyte Chemistry and Electroplating Conditions

An exemplary method for high rate electroplating with a DSI-containing electrolyte is illustrated in the process flow diagram of FIG. 3. The process starts in 301 by determining a critical potential for a DSI compound for a specific set of conditions. The critical potential can be determined by performing a CV experiment using specific conditions (e.g., electrolyte composition, substrate rotation rate, etc.), and determining the critical potential by analyzing the CV curve, as described in the previous section. In some embodiments, the CV experiments are performed at a sweep rate of about 2 mV/second, in order to allow enough time so that pseudo steady state conditions can be assumed for each potential. The critical potential can be dependent on specific conditions, and may shift with the variation of concentrations of electrolyte components. In some embodiments, critical potentials for several conditions may be determined, and the conditions for which DSI behavior is most well-pronounced may be selected for the actual TSV filling. While this screening step is highly useful for determining suitable conditions for high-rate bottom-up electroplating, it can also be considered optional, because in some embodiments, the critical potentials for specific DSIs are pre-determined under a variety of conditions, compiled, and provided to the user in any suitable form as instructions (e.g., in the form of program instructions).

Next, in 303, a substrate having one or more large, high aspect ratio features (e.g., TSVs) is provided to an electroplating apparatus. A variety of plating apparatus systems may be used, including substrate face-up and substrate face-down systems. In some embodiments, an electroplating apparatus, which is configured for rotating the substrate during electroplating with an option of modulating the rotation speed, is preferred. An example of a suitable apparatus is a SABRE™ electroplating apparatus available from Novellus systems, Inc. (San Jose, Calif.).

In operation 305, the substrate is contacted with an electroplating solution, where the solution comprises copper ions and an organic DSI additive, and electroplating is performed under potential-controlled conditions, where the potential is controlled not to exceed the critical potential of the DSI compound for the selected set of conditions. One or more of electrical connections are made to the substrate seed layer (typically at the periphery of the substrate), and the substrate is connected with a power supply and is negatively biased to serve as a cathode.

The composition of the plating solution used during the plating step, will typically be similar or substantially the same as the composition of the electrolyte used for critical potential determination in step 301 (although minor variations are possible). Alternatively, the composition of the plating solution used during the plating step, will be similar or substantially the same as the composition of the electrolyte for which the critical potential has been previously determined and compiled in the instructions.

Generally, the electrolyte can contain one or more copper salts, which may include without limitation copper sulfate, copper methanesulfonate, copper propanesulfonate, copper gluconate, copper pyrophosphate, copper sulfamate, copper nitrate, copper phosphate, copper chloride, and their various combinations. In some embodiments, copper sulfate, and copper alkanesulfonates are preferred sources of copper ions. Mixtures of copper sulfate and copper alkanesulfonates may be used in some embodiments. The concentration of copper ions in a typical electrolyte is at least about 10 g/L, such as between about 10 g/L and 200 g/L. In some embodiments, high concentrations of copper are preferred for faster plating. For example high copper electrolytes containing at least about 40 g/L such as at least about 60 g/L of $Cu^{2+}$ ion (e.g., between about 40-200 g/L, such as between about 60-150 g/L) are used in some embodiments. While in some embodiments electroplating is performed at room temperature (e.g., at about 20-25° C.), in other embodiments it may be preferable to conduct electroplating at an elevated temperature in order to increase the solubility of copper salts, and, consequently, the available copper ion concentration. The higher temperature also allows for faster diffusion of the copper ions and therefore higher achievable plating rates. For example, in some embodiments, electroplating is performed at an elevated electrolyte temperature of about 30-80° C., such as between about 40-60° C. Most commonly, plating is performed at electrolyte temperatures of between about 20-60° C.

In some embodiments (although not necessarily), the electrolyte further includes an acid, such as sulfuric acid, methanesulfonic acid, propanesulfonic acid, nitric acid, phosphoric acid, hydrochloric acid and various combinations thereof. For example, the electrolyte solution in one embodiment contains copper sulfate and sulfuric acid. When sulfuric and/or methanesulfonic acid is used, the concentrations of at least about 1 g/L, are preferred. The acid serves to increase the conductivity of electrolyte. Preferably electrolytes with conductivities of at least about 40 mS/cm are used. Such electrolytes can be obtained, for example, by using sulfuric acid and/or methanesulfonic acid at a concentration of at least about 1 g/L. In some embodiments, the electrolyte comprises sulfuric acid and/or methanesulfonic acid at concentrations of between about 10-200 g/L. In some implementations high acid electrolytes, which contain at least about 0.4 M of strong acid, such as between about 1-2 M of strong acid, are preferred for high speed plating. For example, high acid electrolytes containing between about 40-200 g/L of sulfuric acid, methanesulfonic acid or mixtures thereof, are used in some embodiments.

In some embodiments, although not necessarily, the electroplating solution provided herein has a relatively high concentration of acid in addition to high concentration of $Cu^{2+}$. Electrolytes with such combination can achieve particularly high plating rates. However, in some embodiments, certain DSI compounds may have DSI behavior only at certain concentration ranges of copper or acid. For example, the BDHAC DSI additive is preferably used in low acid electrolytes (preferably, less than about 0.4 M of acid, e.g., less than about 40 g/L of sulfuric acid), because at higher acid concentrations its DSI switching capability is reduced. Other DSIs, such as thonzonium bromide maintain DSI switching characteristics over a wide range of acid concentrations and may be used both in low acid, medium acid, and high acid electrolytes.

The concentration of DSI molecule in the electrolyte will depend on the type of the DSI compound. In some implementations, concentrations of DSI additives are between about 5-200 ppm, more preferably, between about 10-60 ppm.

Notably, the plating electrolytes provided herein, do not require any additional electrochemically active additives. In some embodiments, the DSI compound (or several DSI compounds) is the only electrochemically active additive present in the plating solution. In some embodiments, the plating solution is substantially free of halide additives (apart from the counterions of DSI compounds). In some embodiments, the solution contains essentially no chloride or bromide in addition to any chloride or bromide which may be inherently present in the DSI chloride or bromide salt. In some embodiments, the plating solution is substantially free of plating accelerators and/or suppressors.

While these additives are not absolutely required, in some embodiments, one or more of them may be present in the plating solutions, as they may be helpful to fine-tune the plating performance.

In some embodiments, the plating solution contains chloride ion at a concentration of between about 5-300 ppm.

In some embodiments, the plating solution may further include accelerators. Accelerators may include a sulfur, oxygen, or nitrogen functional group that help to increase deposition rates and may promote dense nucleation leading to films with a fine grain structure. In some embodiments, accelerators include a S—S disulfide group. Accelerators may be present at a low concentration level, for example 1-200 ppm. Examples of accelerators include 3-Mercapto-1-propanesulfonic acid, bis-(3-sodiumsulfopropyldisulfide) (SPS), and N,N-dimethyl-dithiocarbamyl propylsulfonate (DPS).

In some embodiments, the plating solution may further include electrochemical suppressors. Suppressors are additives that reduce the plating rate and are usually present in the plating bath at higher concentrations than accelerators, for example, at 5-1,000 ppm. They are generally polymeric surfactants with high molecular weight, such as polyethylene glycol (PEG) and polyethyleneoxide (PEO) or block copolymers of the two. The suppressor molecules slow down the deposition rate by adsorbing on the surface and forming a barrier layer to the copper ions. Because of their large size and low diffusion rate, suppressors are less likely to reach the lower part of the TSV than the wafer field resulting in lower initial concentrations at the bottom of the TSV. Therefore, most of suppressing effect occurs initially on the surface of the substrate (field region), helping to reduce overburden and avoid TSV hole "closing". In some embodiments, the accelerators are used in combination with the suppressors. The large size of the suppressor allows for it to diffuse into the feature slower than the accelerator and therefore there is an initial build up of accelerator at the bottom for the feature. This then repels the adsorption of the suppressor and therefore creates a suppression differential between the field and the bottom of the feature which drives the fill from the bottom up.

In some embodiments, the plating solution may include levelers. Levelers are the additives whose purpose it is to deactivate the fast moving accelerated surface and also planarize the field. They are present, if at all, in very small concentrations, such as 1-500 ppm, and their blocking effects at the surface are highly localized. Levelers are also generally electrochemically active (unlike the suppressor molecule). The reaction rate of the leveler at the surface combined with their generally low concentration cause the leveler to often be driven by diffusional effects. As a result, levelers selectively reduce deposition mainly on the high spots of the plated substrate allowing the low spots to level out. This behavior can also be used to enhance the plating rate of copper at the base of the TSV relative to the growth rate on the wafer field. In some cases, levelers may contain functional groups which include nitrogen atoms which exhibit a tendency to form complexes with Cu(I) ions at the wafer interface.

In some embodiments, the additives further reduce the current density (and the plating rate) in the field and at the upper lip of the TSV relative to the current density in the field that would have been obtained in the absence of additives. The additives help achieve void-free filling by increasing the relative plating rate at feature bottom relative to feature opening, and can be used in synergy with the DSI compounds. This differential is often termed "throwing power".

Examples of suitable electrolyte compositions are listed below:

1. 50 g/l $Cu^{2+}$ (in the form of copper sulfate)/100 g/l $H_2SO_4$/50 ppm $Cl^-$+50 ppm Benzyldimethylhexadecylammonium chloride 2. 70 g/l $Cu^{2+}$ (in the form of copper sulfate)+50 ppm Benzyldimethylhexadecylammonium chloride 3. 50 g/l $Cu^{2+}$ (in the form of copper sulfate)/100 g/l $H_2SO_4$+50 pm Benzyldimethylhexadecylammonium chloride 4. 50 g/l $Cu^{2+}$/10 g/l $H_2SO_4$+30 ppm Thonzonium Bromide 5. 120 g/l $Cu^{2+}$ ((in the form of copper methanesulfonate)/20 g/l Methane Sulfonic Acid/50 ppm $Cl^-$+1 ppm Accelerator+200 ppm Suppressor+Enthone DVF 200 C.

If the actual plating solution contains organic additives (e.g., accelerators and suppressors) in addition to DSI, the relevant critical potential for this system is determined by performing a CV experiment for the electrolyte of substantially the same composition (e.g., including the accelerator and suppressor). It is understood that in some embodiments determination of critical potential for every set of conditions may not be required, and the critical potential can be estimated from the data obtained for similar conditions. That is, in some embodiments electroplating bath composition and the composition of the bath used in CV experiments may differ.

Returning to operation 303, shown in FIG. 305, the substrate is contacted with the plating solution containing a DSI additive under potential-controlled conditions, where the potential is controlled not to exceed the critical potential of the DSI compound for the selected set of conditions. The potential is referred to the potential of the electrically biased substrate relative to OCP, preferably corrected for any ohmic drop. Potential-controlled plating is, in many implementations, preferred plating method for DSI-containing electrolytes as compared to uncontrolled or solely current-controlled plating options. This is because potential-controlled plating maximizes the benefits that are provided by the switching behavior of DSI compounds. When electroplating is performed at a controlled potential below the critical potential of the DSI, it is ensured by the basic electrochemical properties of the DSI switch that at this potential the plating in the field region will be efficiently inhibited by the DSI presence, resulting in very low deposition rates in the field, and allowing for highly selective deposition within the recessed features. In contrast, if the potential during deposition is not controlled, and is allowed to exceed the critical potential of the DSI, the DSI inhibition in the field will be essentially switched off, resulting in fast deposition in the field region and/or formation of voids in the recessed feature (due to faster deposition on the sidewalls). Therefore, electroplating in potential-controlled regime provides significant control over the overall quality of electrofilling and over the relative filling rates in the field and in the recessed feature.

In some embodiments, the potential during plating is further controlled, such that it does not drop lower than 150 mV, such as lower than about 100 mV, relative to the critical potential of the DSI for the selected plating conditions. It is preferable that most of the plating is performed at a controlled potential that is close to the DSI critical potential but does not exceed it. If the potential is allowed to drop below recited values, electroplating within the recessed features can become unacceptably slow, or metal deposition within the recessed features may even stop completely. Therefore, plating rate within the feature can be maximized by controlling the potential, such that it is maintained just below the critical potential of the DSI molecule.

It is understood that potential-controlled plating does not require that the potential is kept constant during the plating process. While in some embodiments, potentiostatic plating (plating at a constant potential) is practiced, in other embodiments, the potential may be changed within the provided guidelines, in a variety of ways. For example, the potential may be ramped up or down, and the ramping can be done continuously, or in a step function. In some embodiments, potential pulsing may be used.

The potential-controlled plating can be accomplished by using a reference electrode positioned in the proximity of the substrate, or, in some embodiments, a current waveform corresponding to desired potential-controlled conditions can be pre-generated, and later used for plating in the absence of a reference electrode.

In general, a variety of reference electrodes can be used for measuring and controlling the potential, including saturated calomel electrode, palladium-hydrogen electrode, silver chloride electrode, etc. In some embodiments, the reference electrode is an unpolarized metal electrode, which comprises the same metal that is being electroplated. For example, when copper is plated, the reference electrode may include a copper strip or wire. Preferably, the reference electrode is positioned in the proximity of the substrate to minimize the ohmic drop during measurement. In some embodiments, the reference electrode resides in chamber (e.g., in a partially closed compartment) in ionic communication with the main plating bath. The reference electrode in this chamber is immersed into a reference electrode solution. In a preferred embodiment, the reference electrode solution does not contain a DSI compound. In some embodiments, the reference electrode solution is substantially free of all organic additives, but includes all of the inorganic components as in the plating bath and at substantially the same concentrations as in the plating bath. The reference electrode chamber may be fluidically connected to the main plating bath via an ion-permeable membrane, such as a cation-permeable membrane, which would allow copper ions to travel between the plating bath and the reference electrode solution, but would not allow the organic molecules to diffuse from the plating bath to the reference electrode solution. In other embodiments, the reference electrode chamber is fluidically connected to the main plating bath via an electrolyte-filled capillary tube. The reference electrode chamber may be periodically flushed with DSI-free electrolyte to avoid DSI contamination of the reference electrode solution.

In some embodiments, in addition to the reference electrode, the electroplating system further comprises at least one cathode sense lead, in contact with the substrate, configured for measuring the substrate potential. The system which includes both the reference electrode and the cathode contact sense lead allows for more accurate correction of the measured potential for the ohmic drop. The details of such system and its use in potential-controlled plating are described, for example, in the U.S. Pat. No. 6,562,204 titled "Apparatus for Potential Controlled Electroplating of fine Patterns on Semiconductor Wafers", issued to Mayer et al., on May 13, 2003, and which is herein incorporated by reference in its entirety and for all purposes. The reference electrode and the cathode sense lead (if present) are connected to the system controller, which also controls biasing of the substrate at a controlled potential.

In some embodiments, the potential-controlled electroplating can be performed in the absence of a reference electrode. In this embodiment prior to actual plating, a current waveform corresponding to the desired potential profile, is first determined, for a substrate. The current waveform can be first determined using the reference electrode for potential measurement, and recording the desired current waveform for a desired range of potentials. After the required current waveform has been determined, it can be used for electrofilling on similar substrates under similar conditions in an electroplating apparatus, which need not have a reference electrode. Thus, in this embodiment, the potential-controlled conditions are created by applying a specific current waveform, which was designed such that a desired potential is obtained on a substrate (e.g., such that the potential does not exceed DSI critical potential, and such that the potential does not drop lower than about 150 mV relative to the critical potential.

Figure 3A:
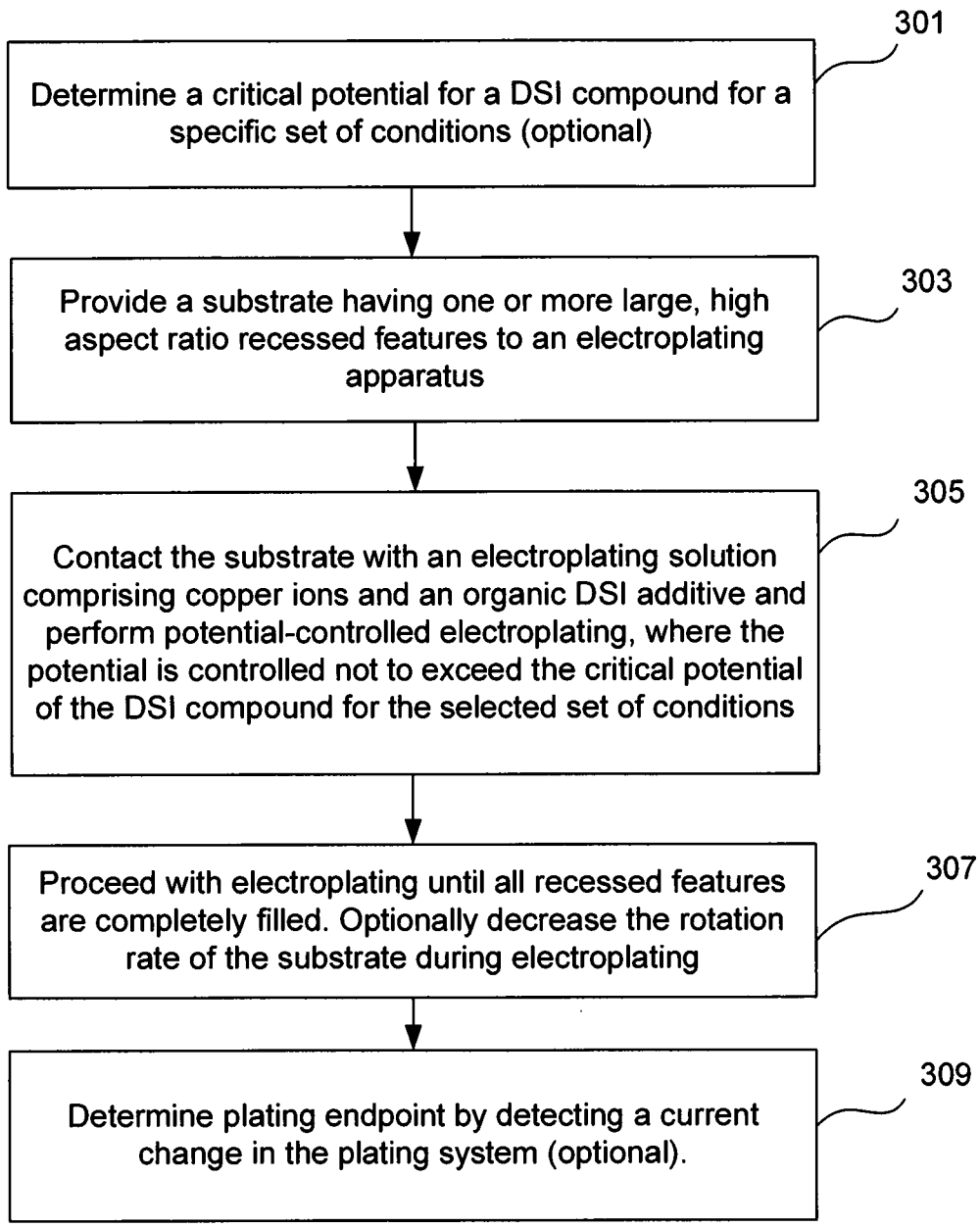
FIG. 3A is an illustrative process flow diagram showing an electroplating method in accordance with an embodiment of the invention.

Referring to operation 307 in FIG. 3A, electroplating is performed until all recessed features are completely filled. Optionally the rotation rate of the substrate is decreased during electroplating. The substrate is typically rotated during electroplating at a rotation speed of between about 5 and 120 rpm, preferably between about 10 and 90 rpm At the beginning of the filling process, the copper electrodeposition rate at the bottom portions of the recessed features is typically quite high, but as the filling process progresses, the electrodeposition rates start dropping. In the systems which involve plating with DSI, the filling rates can be increased by decreasing the rotation rate of the substrate. In some embodiments, after the recessed feature has been partially filled at a first rotation rate, the substrate rotation rate is reduced. For example, the rate reduction can take place after about 80% of the recessed feature depth has been filled. Preferably, in the final stages of plating (e.g., after at least about 95% of feature depth has been filled), the substrate rotation rate is less than about 90 rpm. In some embodiments the rotation rate is decreased after the initial growth has started at the bottom of the feature (e.g., when less than about 20% of feature depth has been filled). Provided methods can also be used to fill arrays of recessed features having different sizes and/or aspect ratios. Advantageously, these methods can be used to uniformly fill features in such arrays at substantially the same total times, reducing the incidence of overplating and insufficient fill in individual features.

Figure 3B:
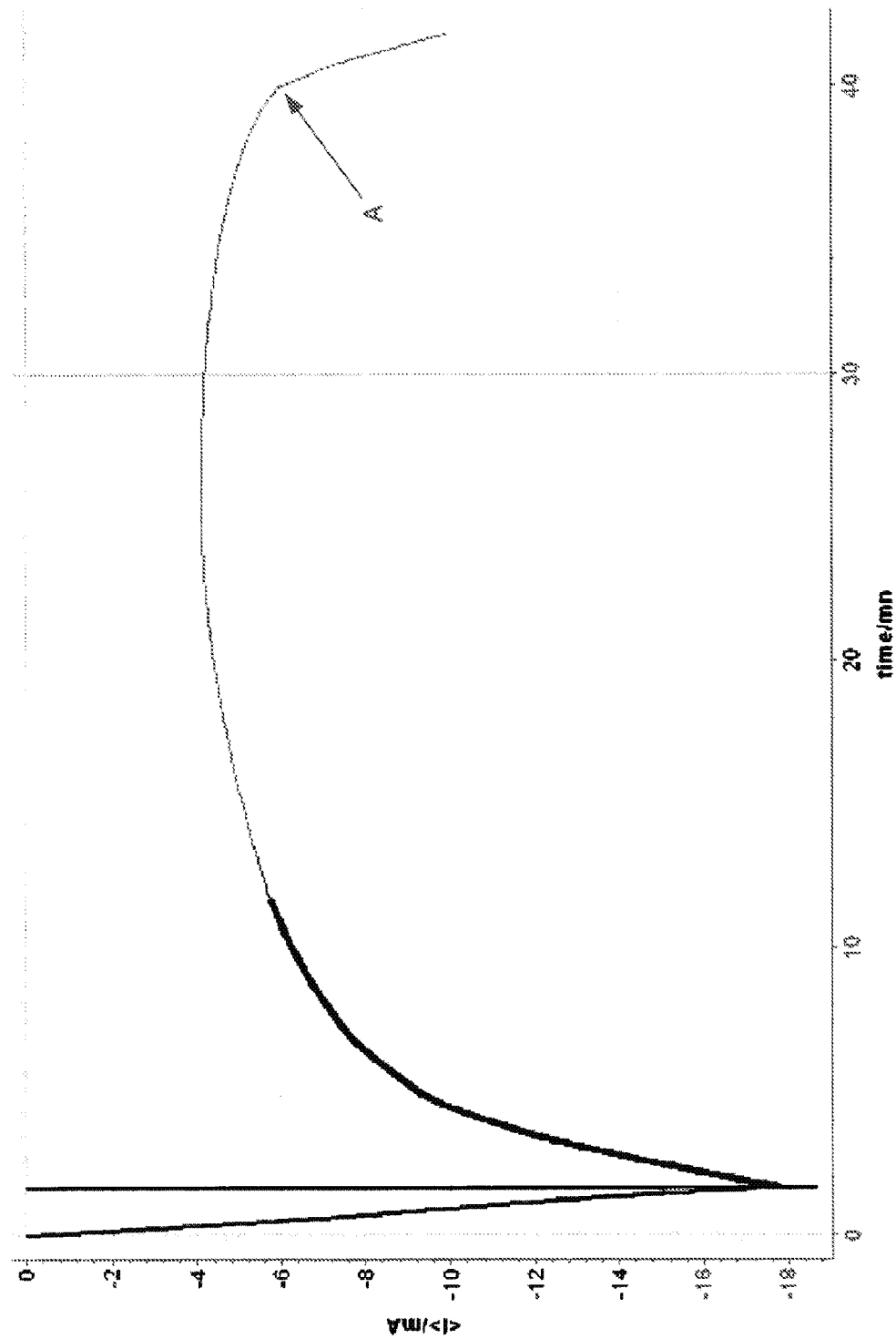
FIG. 3B shows a current versus time plot, illustrating an increase in current at the plating endpoint.
Figure 3C:
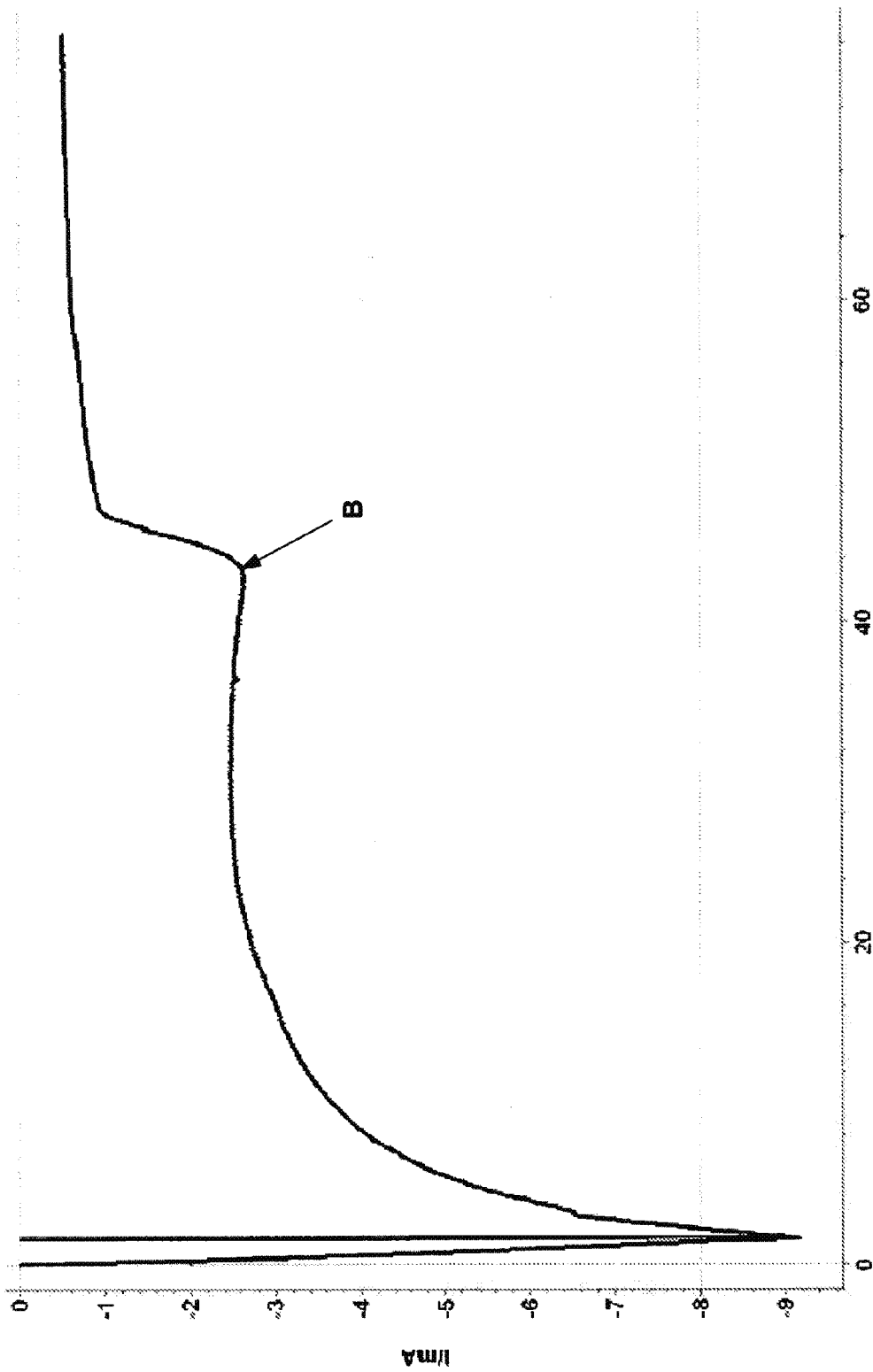
FIG. 3C shows a current versus time plot, illustrating a decrease in current at the plating endpoint.

After the recessed features have been filled, a decrease or an increase in current can result in various embodiments. For example, in some embodiments, when potential is kept constant, the filling rate is slowing down when it reaches the field. This change in current can be measured, e.g., by various amperometric techniques, and can be used to detect plating endpoint, as shown in operation 309. In some embodiments, an increase in current is observed, when the filling reaches the field. In some embodiments, plating is stopped after a decrease or increase in current as the filling reaches the field. This is seen by an inflection in the current vs. time plot. A plot illustrating an increase in current at the completion of filling is shown in FIG. 3B. An inflection A at about 40 minutes corresponds to the increase in current signaling that the fill endpoint. A plot illustrating a decrease in current at the completion of filling is shown in FIG. 3C. An inflection A at about 40 minutes corresponds to the increase in current signaling that the fill endpoint.

While potential-controlled plating with DSI-containing electrolytes described in FIG. 3A, is particularly advantageous, the invention is not generally limited to plating under potential-controlled conditions.

Generally, electroplating with DSI-containing electrolytes, e.g., with non-polymeric quartenary ammonium salt DSIs described herein, can be carried out under current-controlled or potential-controlled conditions, without limitation.

Another important feature of the filling process, which can be advantageously used in combination with plating methods described herein, is the substrate pre-treatment process, in which the substrate is pre-wetted under conditions which are engineered to reduce or eliminate bubble entrapment within the recessed features. Such pre-wetting process, suitable for use with provided plating methods, is described in detail in the U.S. patent application Ser. No. 12/684,787 titled "Wetting Pretreatment for Enhanced Damascene Metal Filling" by Mayer et al, filed Jan. 8, 2010, which is herein incorporated by reference in its entirety and for all purposes.

Figure 4:
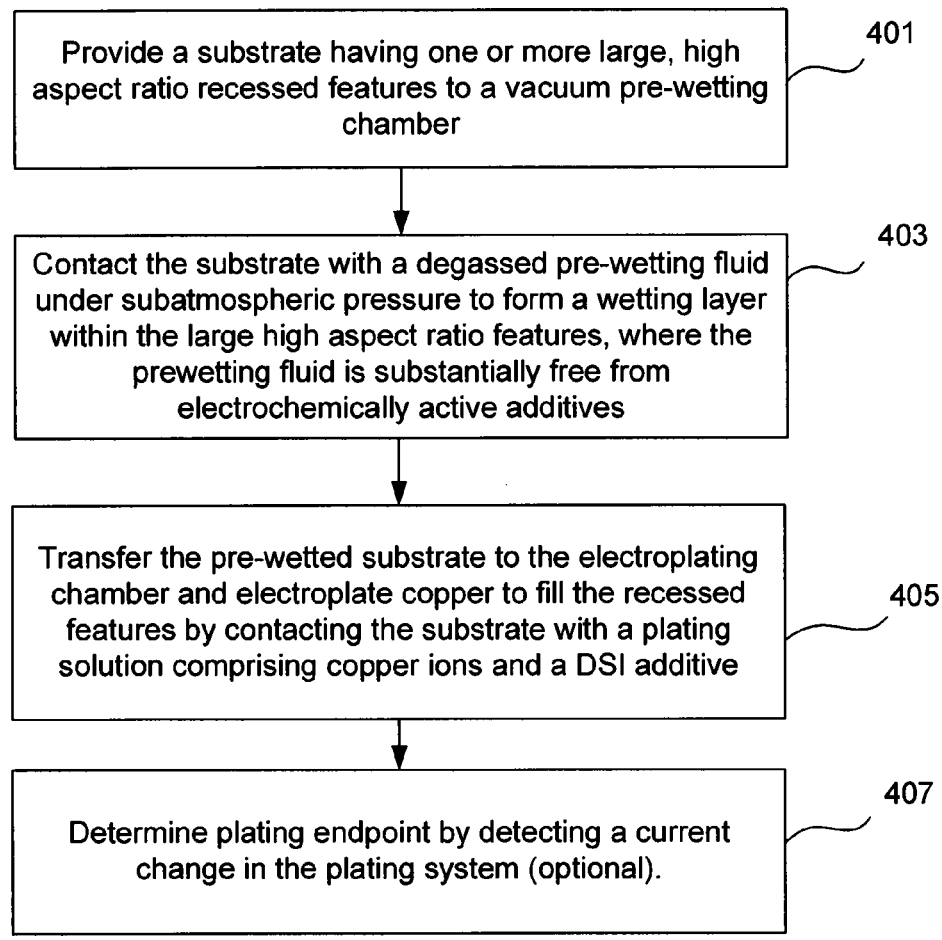
FIG. 4 is an illustrative process flow diagram showing an electroplating method in accordance with an embodiment of the invention.

A process flow diagram, illustrating the use of a pre-wetting process in combination with provided filling methods, is shown in FIG. 4. The process start in 401 by providing a substrate having one or more large, high aspect ratio recessed features to a vacuum pre-wetting chamber. The pre-wetting process is particularly important for substrate having recessed features (e.g., TSVs) with widths of at least about 1 µm, and aspect ratios of at least about 5:1, because bubble entrapment in such larger features is significantly more problematic than in submicron Damascene vias. In the absence of pre-treatment, bubbles of air or of other gases typically become entrapped within the recessed features leading to deleterious effects during the electrofill process. If bubbles are not removed, electrofilling can result in creation of large voids within the features.

The pre-treatment process, in accordance with some embodiments, as shown in operation 403, comprises contacting the substrate with a degassed pre-wetting fluid under subatmospheric pressure to form a wetting layer within the recessed features. Preferably, the pre-wetting fluid is substantially free from electrochemically active additives, such as from DSI compounds and accelerators. In some embodiments, a dedicated pre-wetting chamber configured for creating a subatmospheric pressure environment, and configured for bringing the substrate in contact with a degassed fluid, is used. In some embodiments, the pre-wetting chamber is part of a module which contains a pre-wetting chamber, and an electroplating chamber. In other embodiments, pre-treatment is performed in the electroplating chamber prior to electroplating.

The important feature of the pre-treatment is the nature of the pre-wetting fluid, and the fact that the pre-wetting fluid is thoroughly degassed. Preferably, the pre-wetting fluid is not only deoxygenated, but is also treated to remove other dissolved gases, such as nitrogen. In some embodiments, degassing is accomplished by passing the pre-wetting fluid through a membrane contact degasser for removing one or more dissolved gases (e.g., both $O_2$ and $N_2$) from the pre-wetting fluid prior to pre-wetting. Examples of commercially available degassing devices include the Liquid-Cel™ from Membrana of Charlotte, N.C. and the pHasor™ from Entegris of Chaska, Minn. Generally, the pre-wetting fluid can be delivered onto the substrate in a liquid or in a gaseous form, while the substrate is in a vacuum environment. When the pre-wetting fluid is a liquid, it can be delivered onto the substrate, e.g., by spraying or flowing over the substrate, or the substrate can be immersed into the pre-wetting liquid. When the pre-wetting fluid is gaseous under the vacuum environment used, it is allowed to condense within the recessed features. As a result, a bubble-free layer of pre-wetting liquid is formed within the recessed features.

The chemistry of the pre-wetting fluid plays an important role in the success of plating. Preferably, the pre-wetting fluid is substantially free of electrochemically active additives, such as DSIs, halides, or accelerators. Organic electrochemically inactive additives, which do not substantially interfere with the kinetics and thermodynamics of electrochemical reactions, such as wetting agents, may be present. In some embodiments, the pre-wetting fluid is a thoroughly degassed DI water. In other embodiments, the pre-wetting fluid further includes a metal salt, such as a copper salt. In some embodiments, aqueous solutions containing copper sulfate and/or copper alkylsulfonate are preferred. In some embodiments, it is preferable that the concentration of copper ion in the pre-wetting fluid is greater than the concentration of copper ion in the plating electrolyte. For example, pre-wetting fluid may consist essentially of water and copper salt, where the concentration of copper ion is at least 25% greater than the concentration of copper ion in the plating electrolyte. In some embodiments, the concentration of copper ion in the pre-wetting fluid is at least about 20 g/L. The pre-wetting fluid, in some embodiments, further contains an acid, but preferably at a low concentration, such that the pH of the pre-wetting fluid is greater than about 2.

After the substrate is pre-wetted, and the wetting layer of degassed pre-wetting fluid is formed within the recessed features, the vacuum is released, and the chamber is brought to an atmospheric pressure. Then, in operation 405, the substrate is transferred to the electroplating chamber, where copper is electroplated to fill the recessed features using an electroplating solution which comprises copper ions and DSI additives. Optionally, the endpoint of plating can be detected by detecting a current drop in the plating system, as shown in 407.

EXPERIMENTAL

Example 1

Electroplating with an Electrolyte Containing Thonzonium Bromide DSI

The preferred plating conditions for a plating electrolyte containing thonzonium bromide, were determined by running a series of CV experiments. The chemical structure of thonzonium bromide is shown below:

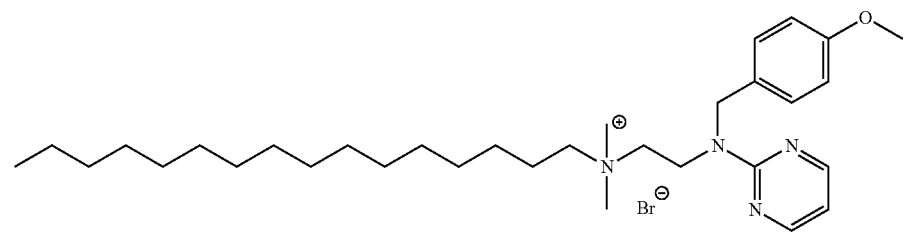

Thonzonium Bromide

Prior to performing CV experiments, a platinum rotating disk working electrode (RDE) surface was plated with copper from an additive-free electrolyte, containing copper sulfate (at 70 g/L copper ion concentration) and sulfuric acid (at 20 g/L $H_2SO_4$ concentration). The exposed electrode surface prior to each CV experiment was a fresh copper surface. Plating of fresh copper layer was performed at a current density of 5 mA/cm$^2$ to deposit about 5000 Å over the 0.1965 cm$^2$ Pt disk electrode. After each CV experiment, all of copper was etched and removed from the Pt RDE, and fresh copper metal was redeposited thereafter prior to subsequent CV test.

Unless otherwise noted, CV experiments were performed at room temperature in a system comprising a separate anode chamber (SAC), where the anode-containing portion was separated from the cathode-containing portion by a cationic Nafion membrane. The electrolyte in the anode chamber did not contain organic additives, but had the same inorganic components as the electrolyte in the cathode chamber. Unless otherwise noted, the voltage sweep rate used in CV experiments was 2 mV/second, and Hg/Hg$_2$SO$_4$ electrode was used as a reference electrode.

The electrolytes used in CV experiments contained copper sulfate (20 gl/L-70 g/L Cu$^{2+}$), sulfuric acid (0 g/L-100 g/l H$_2$SO$_4$), thonzonium bromide (0-50 ppm) and, optionally, HCl as a source of chloride additive (0-50 ppm). The rotation rate of the electrode was varied from 12 to 120 rpm.

It was determined by obtained CV curves, that thonzonium bromide maintains good DSI switching behavior both in the absence and in the presence of chloride additive, as well as at high-acid conditions (at 100 g/L H$_2$SO$_4$ concentration).

Exemplary conditions determined to be suitable are as follows: copper sulfate (20 gl/L-70 g/L Cu$^{2+}$), sulfuric acid (0 g/L-100 g/l H$_2$SO$_4$), thonzonium bromide (10-50 ppm) and, optionally, HCl as a source of chloride additive (0-50 ppm). The rotation rate of the electrode can be varied from 12 to 120 rpm.

Figure 5:
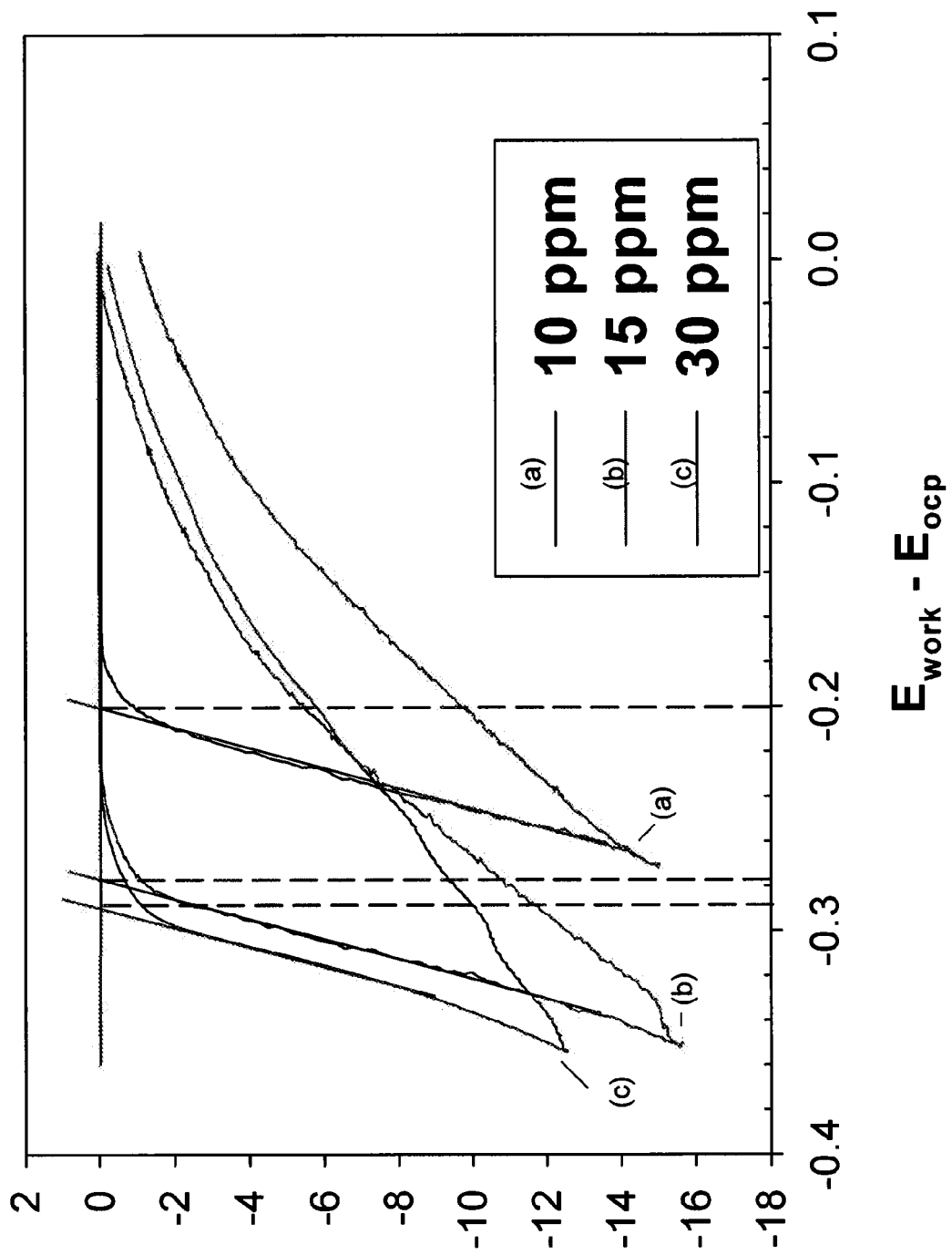
FIG. 5 illustrates DSI behavior for thonzonium bromide.

FIG. 5 illustrates CVs for electrolyte compositions containing different concentrations of thonzonium bromide DSI compound.

Specific sets of conditions illustrated in CVs shown in FIG. 5 were as follows:

copper sulfate (70 g/L Cu$^{2+}$), sulfuric acid (100 g/L H$_2$SO$_4$), thonzonium bromide (10 ppm (curve a), 15 ppm (curve b) and 30 ppm (curve c)). No HCl was used in these experiments. The rotation rate of the substrate was 30 rpm. The critical potentials of thonzonium bromide for these sets of conditions were determined to be:

$E_{crit}$(10 ppm thonzonium bromide)=−0.2 V vs. OCP $E_{crit}$(15 ppm thonzonium bromide)=−0.279 V vs. OCP $E_{crit}$(30 ppm thonzonium bromide)=−0.29 V vs. OCP Next, a substrate containing an array of TSVs, where each TSV was 10 micron wide and 60 micron deep was electrofilled with copper, using the electrolyte composition determined to be optimal by CV (30 ppm of thonzonium bromide).

The substrate was pre-wetted by spraying it with a degassed DI water under subatmospheric pressure, and was then transferred to an electroplating apparatus, where the features were filled by contacting the substrate with a plating electrolyte having the following composition: copper sulfate (70 g/L Cu$^{2+}$), sulfuric acid (100 g/L H$_2$SO$_4$), thonzonium bromide (30 ppm). No HCl was used in these experiments. The rotation rate of the substrate was 30 rpm. The plating was performed under potential-controlled conditions using Hg/Hg$_2$SO$_4$ as a reference electrode.

Other plating details are shown in Table 2.

TABLE 2

Electrofill of TSVs using an electrolyte comprising thonzonium bromide.

| TSV size | Substrate Rotation Speed | Critical Potential of Thonzonium Bromide | Potential-Controlled Conditions | Time to Complete Fill | Ratio of field thickness to thickness deposited in the TSV. |
|---|---|---|---|---|---|
| 10 μm × 60 μm | Constant 30 rpm | −0.29 V | The potential was applied to the substrate within 5 seconds of substrate contact with the plating solution. The potential was ramped from 0 to −0.2 V vs. OCP at a rate of about 2 mV/second (about 100 seconds total). The potential was kept constant at −0.2 V vs. OCP until features were completely filled. | 30 minutes | 0.0016 |

Example 2

Electroplating with an Electrolyte Containing BDHAC DSI

The preferred plating conditions for a plating electrolyte containing BDHAC, were determined by running a series of CV experiments. The chemical structure of BDHAC is shown below.

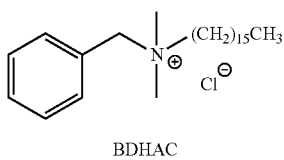

BDHAC

The Pt RDE electrode was prepared for CV experiments, in the same manner as was described in Example 1. The sweep rate and reference electrode used in CV experiments were the same as used in Example 1.

The electrolytes used in CV experiments contained copper sulfate (20-70 g/L $Cu^{2+}$), sulfuric acid (0-100 g/L $H_2SO_4$), BDHAC (5-50 ppm) and, optionally, HCl as a source of chloride additive (0-50 ppm). The rotation rate of the electrode was varied from 30 to 120 ppm.

It was determined by obtained CV curves, that BDHAC maintains good DSI switching behavior at low-acid concentrations, but loses its switching behavior at high acid concentrations (at 100 g/L $H_2SO_4$ and above). While not being bound by the particular theory, it is believed that at high acid concentrations, decrease in pH may result in protonation of the BDHAC amine group, altering the chelating behavior of BDHAC with copper ions.

Exemplary conditions determined to be suitable are as follows: copper sulfate (40-70 g/L $Cu^{2+}$), sulfuric acid (20-50 g/L $H_2SO_4$), BDHAC (20-50 ppm) and, optionally, HCl as a source of chloride additive (0-50 ppm). The rotation rate of the electrode can be varied from 30 to 120 rpm.

Figure 6:
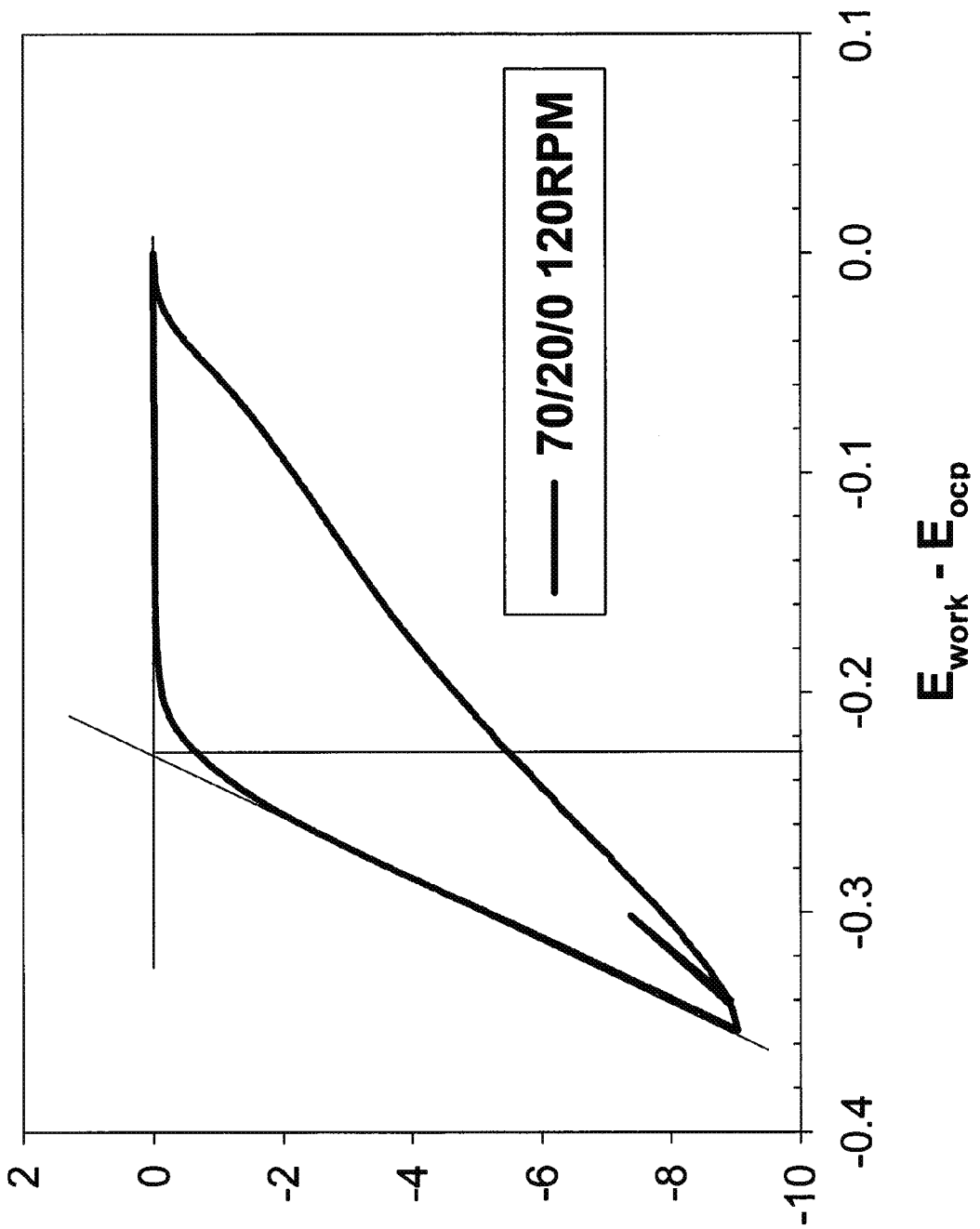
FIG. 6 illustrates DSI behavior for BDHAC

FIG. 6 illustrates a CV showing DSI behavior of thonzonium bromide.

A specific set of conditions illustrated in the CV shown in FIG. 6 is as follows:
copper sulfate (70 g/L $Cu^{2+}$), sulfuric acid (20 g/L $H_2SO_4$), BDHAC (30 ppm) and no HCl. The rotation rate of the electrode was 120 rpm. The critical potential was determined to be −0.23 V vs. OCP potential.

Next, a substrate containing an array of TSVs, where each TSV was 10 micron wide and 60 micron deep was electrofilled with copper, using the electrolyte composition similar to one illustrated in the CV of FIG. 6. For the electrofill experiment the conditions were as follows: copper sulfate (70 g/L $Cu^{2+}$), sulfuric acid (20 g/L $H_2SO_4$), BDHAC (50 ppm) and no HCl. The rotation rate of the electrode was 120 rpm. The plating was performed under potential-controlled conditions using $Hg/Hg_2SO_4$ as a reference electrode.

Other plating details are shown in Table 3.

TABLE 3

Electrofill of TSVs using an electrolyte comprising BDHAC.

| TSV size | Substrate Rotation Speed | Critical Potential of Thonzonium Bromide | Potential-Controlled Conditions | Time to Complete Fill | Ratio of field thickness to thickness deposited in the TSV. |
|---|---|---|---|---|---|
| 10 μm × 60 μm | Constant at 120 rpm | Not determined for 50 ppm BDHAC. Known to be −0.23 for 30 ppm BDHAC. | The potential was applied to the substrate within 5 seconds of substrate contact with the plating solution. The potential was ramped from 0 to −0.18 V vs. OCP at a rate of about 2 mV/second. The potential was kept constant at −0.18 V vs. OCP until features were completely filled. | 35 minutes | 0.0017 |

Excellent void-free fill with minimal deposition of copper in the field region was obtained. An SEM of a cross-section of a partially filled TSV obtained under these conditions was taken. It was observed that the via is filled without any voids, and that the field regions carries essentially no metal, except for the seed layer.

Example 3

Electroplating with an Electrolyte Containing DVF 200 C

The preferred plating conditions for a plating electrolyte containing DVF 200 C, were determined by running a series of CV experiments.

The Pt RDE electrode was prepared for CV experiments, in the same manner as was described in Example 1.

The electrolytes used in CV experiments contained copper sulfate (20-70 g/L $Cu^{2+}$), sulfuric acid (20-100 g/L), DVF 200 C (5-30 mL/L) and, optionally, HCl as a source of chloride additive (0-50 ppm). The rotation rate of the electrode was varied from 30 to 120 ppm.

It was determined by obtained CV curves, that DVF 200 C maintains good DSI switching behavior only at relatively high concentrations of DVF 200 C, but loses its switching behavior at low additive concentrations.

Exemplary conditions determined to be suitable are as follows: copper sulfate (50-70 g/L $Cu^{2+}$), sulfuric acid (20-100 g/L), DVF 200 C (10-20 mL/L) and, optionally, HCl as a source of chloride additive (0-50 ppm). The rotation rate of the electrode can be varied from 30 to 120 ppm.

Figure 7:
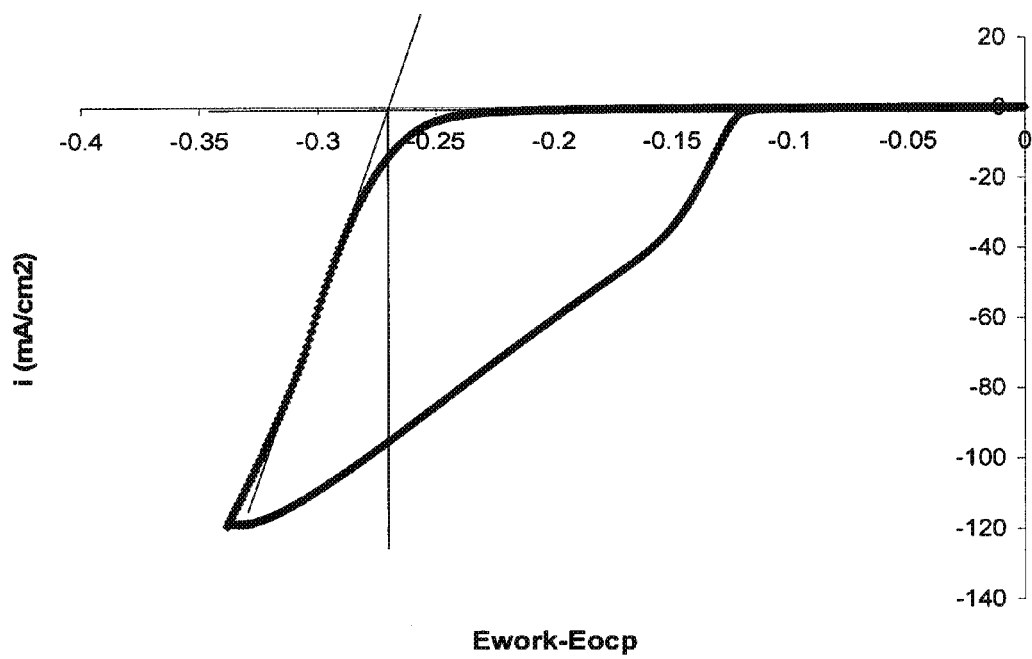
FIG. 7 illustrates DSI behavior for DVF 200 C.

FIG. 7 illustrates a CV showing DSI behavior of DVF 200 C at high concentration.

A specific set of conditions used in a CV illustrated in FIG. 7 is as follows:

copper sulfate (70 g/L $Cu^{2+}$), sulfuric acid (100 g/L), DVF 200 C (30 mL/L), no chloride. The rotation rate of the electrode was 120 rpm. The critical potential was determined to be about −0.275 V versus OCP.

Next, a substrate containing an array of TSVs, where each TSV was 10 micron wide and 60 micron deep was electrofilled with copper, using the electrolyte composition that was similar to the composition described above: copper sulfate (70 g/L $Cu^{2+}$), sulfuric acid (100 g/L), DVF 200 C (15 mL/L), no chloride. The rotation rate of the electrode was 120 rpm for 1 minute and was then reduced to 30 rpm and kept at 30 rpm for 30 minutes. Plating was performed for 31 minutes. The potential was ramped from 0 to −0.21 versus OCP over about a minute and was kept constant at −0.21 V for 30 minutes. The plating was performed under potential-controlled conditions using $Hg/Hg_2SO_4$ as a reference electrode.

An SEM showed a completely filled structure obtained under these conditions. It was observed that the TSV is filled without any voids. However, the grain structure suggested that the organic additive was incorporated into the structure to a substantial degree. Other tested DSIs showed less additive incorporation and a better grain structure.

Example 4

Filling properties for electrolyte baths containing another DSI molecule, DSI1, were studied and are illustrated below.

Figure 10:
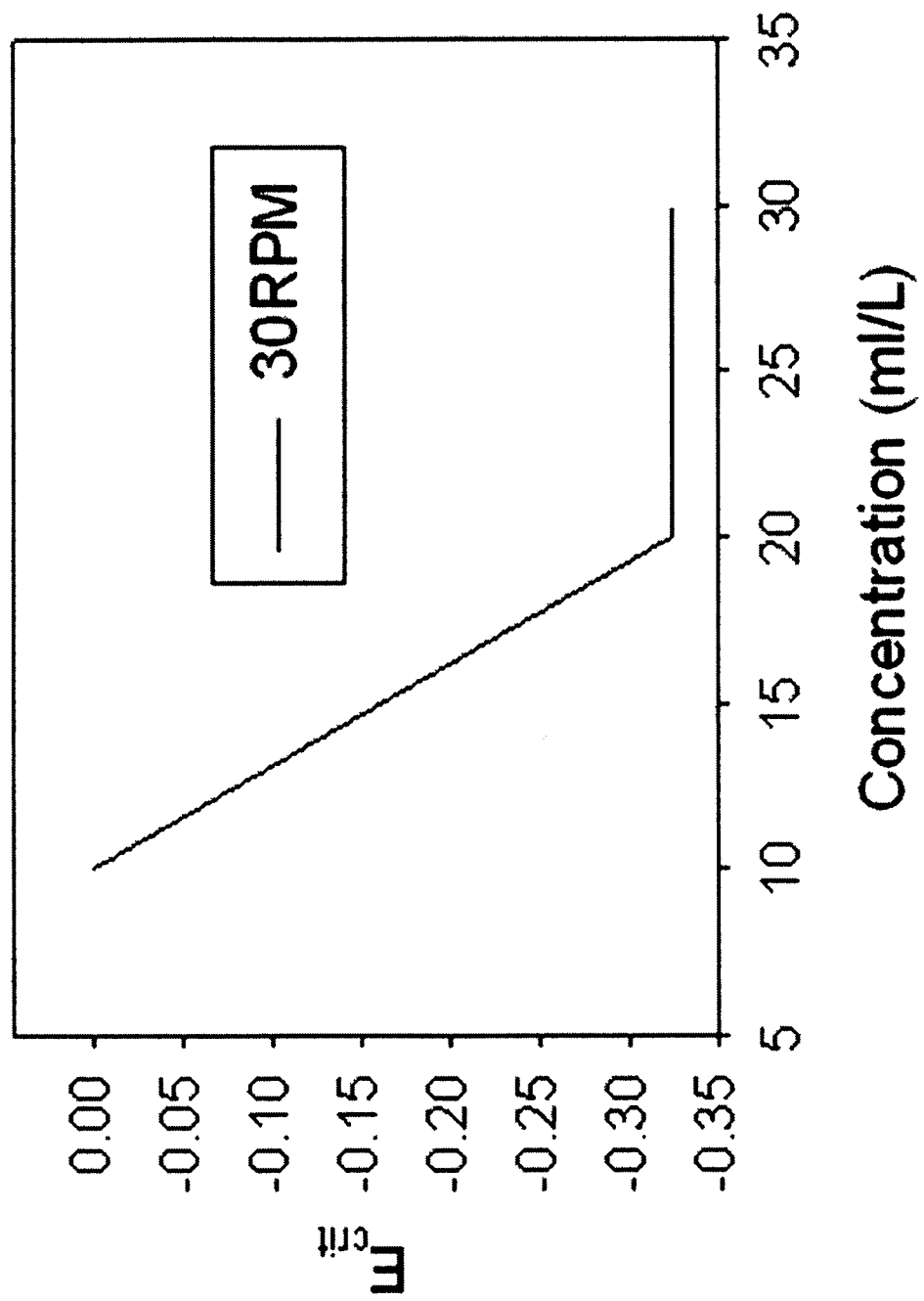
FIG. 10 is a graph illustrating dependence of a critical potential determined from CV plots on a concentration of DSI1 additive.

The electrolytes used in CV experiments contained copper sulfate (20-70 g/L $Cu^{2+}$), sulfuric acid (20-100 g/L), DSI1 additive (10-30 mL/L) and, optionally, HCl as a source of chloride additive (0-50 ppm). The rotation rate of the electrode was varied from 12 to 120 ppm. FIG. 10 illustrates a plot for a critical potential as a function of DSI1 additive concentration at 30 rpm substrate rotation rate.

It was determined by obtained CV curves, that DSI1 additive maintains good DSI switching behavior only at relatively high concentrations of DSI1, but loses its switching behavior at low additive concentrations.

Exemplary conditions determined to be suitable are as follows: copper sulfate (50-70 g/L $Cu^{2+}$), sulfuric acid (20-100 g/L), DSI1 additive (15-30 mL/L) and, optionally, HCl as a source of chloride additive (0-50 ppm). The rotation rate of the electrode can be varied from 30 to 120 ppm.

Figure 11:
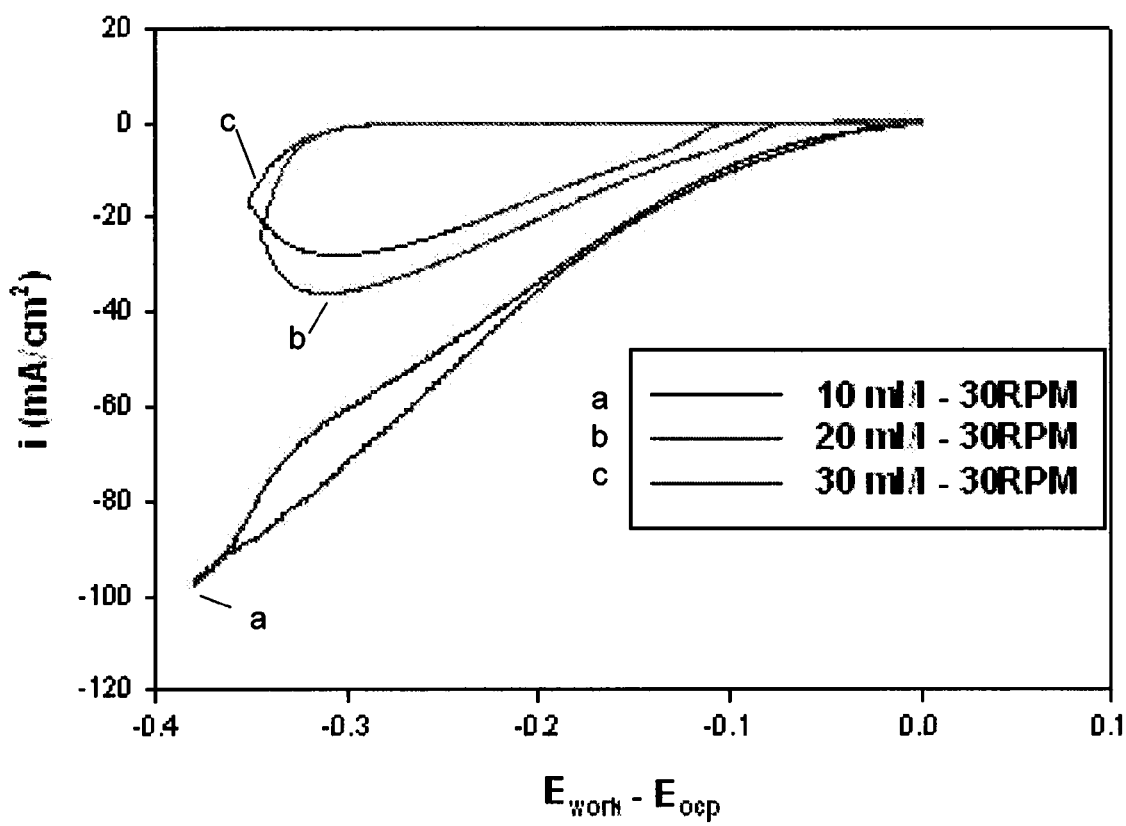
FIG. 11 shows CV curves for electrolytes containing DSI1 additive at 10 ml/L, 20 ml/L, and 30 ml/L (curves a, b, and c respectively). The DSI behavior is pronounced at 20 ml/l and 30 ml/l, but not at 10 ml/l.

A specific set of conditions selected for subsequent electrofill experiment was as follows:

copper sulfate (70 g/l $Cu^{2+}$), sulfuric acid (100 g/l), DSI1 additive (20 ml/l) and, no HCl. The rotation rate was 30 RPM (20 min). The CV curve, illustrating DSI behavior under similar conditions is shown in FIG. 11. The critical potential of DSI1 for this set of conditions was determined to be −0.325V vs. OCP.

Completely filled TSVs (with 10:1 and 8:1 aspect ratios) were obtained using DSI as an additive.

Apparatus

Electroplating Chamber

A general electroplating hardware is now discussed to provide context for the present invention. The apparatus includes one or more electroplating cells in which the substrates (e.g., wafers) are processed. To optimize bottom-up electroplating, additives (e.g., DSIs, and, optionally, accelerators and suppressors) are added to the electrolyte; however, an electrolyte with additives may react with the anode in undesirable ways. Therefore anodic and cathodic regions of the plating cell are sometimes separated by a membrane so that plating solutions of different composition may be used in each region. Plating solution in the cathodic region is called catholyte; and in the anodic region, anolyte. A number of engineering designs can be used in order to introduce anolyte and catholyte into the plating apparatus.

Figure 8:
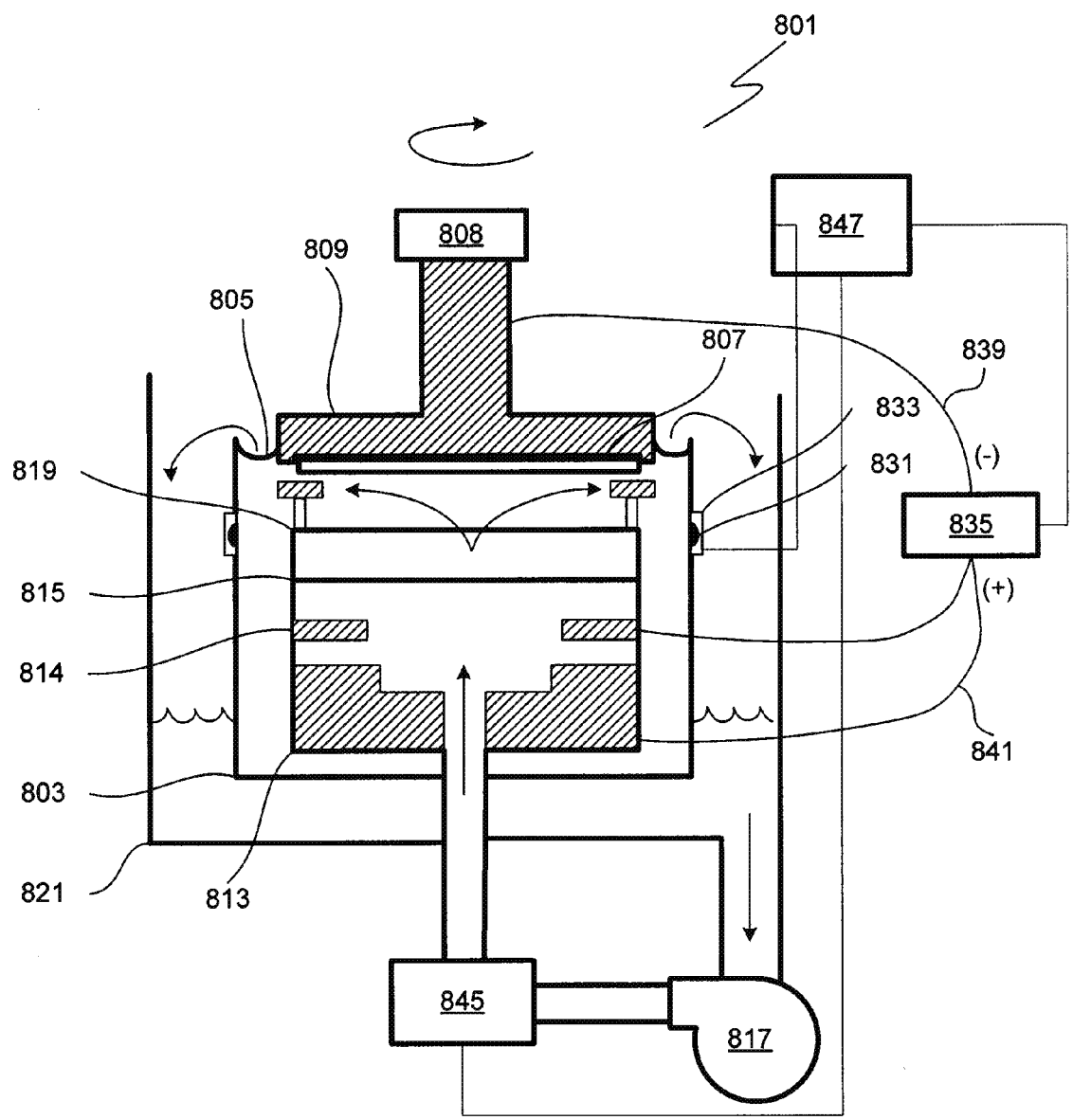
FIG. 8 is a simplified schematic presentation of an electroplating apparatus suitable for filling TSVs in accordance with an embodiment provided herein.

Referring to FIG. 8, a diagrammatical cross-sectional view of an electroplating apparatus 801 in accordance with one embodiment is shown. The plating bath 803 contains the plating solution (having a composition as provided herein), which is shown at a level 805. The catholyte portion of this vessel is adapted for receiving substrates in a catholyte. A wafer 807 is immersed into the plating solution and is held by, e.g., a "clamshell" holding fixture 809, mounted on a rotatable spindle 811, which allows rotation of clamshell 809 together with the wafer 807. A general description of a clamshell-type plating apparatus having aspects suitable for use with this invention is described in detail in U.S. Pat. No. 6,156,167 issued to Patton et al., and U.S. Pat. No. 6,800,187 issued to Reid et al, which are incorporated herein by reference for all purposes.

An anode 813 is disposed below the wafer within the plating bath 803 and is separated from the wafer region by a membrane 815, preferably an ion selective membrane. For example, Nafion™ cationic exchange membrane (CEM) may be used. The region below the anodic membrane is often referred to as an "anode chamber." The ion-selective anode membrane 815 allows ionic communication between the anodic and cathodic regions of the plating cell, while preventing the particles generated at the anode from entering the proximity of the wafer and contaminating it. The anode membrane is also useful in redistributing current flow during the plating process and thereby improving the plating uniformity. Detailed descriptions of suitable anodic membranes are provided in U.S. Pat. Nos. 6,126,798 and 6,569,299 issued to Reid et al., both incorporated herein by reference for all purposes. Ion exchange membranes, such as cationic exchange membranes are especially suitable for these applications. These membranes are typically made of ionomeric materials, such as perfluorinated copolymers containing sulfonic groups (e.g. Nafion™), sulfonated polyimides, and other materials known to those of skill in the art to be suitable for cation exchange. Selected examples of suitable Nafion™ membranes include N324 and N424 membranes available from Dupont de Nemours Co.

During the plating the ions from the plating solution are deposited on the substrate. The metal ions must diffuse through the diffusion boundary layer and into the TSV hole. A typical way to assist the diffusion is through convection flow of the electroplating solution provided by the pump 817. Additionally, a vibration agitation or sonic agitation member may be used as well as wafer rotation. For example, a vibration transducer 808 may be attached to the wafer chuck 809.

The plating solution is continuously provided to plating bath 803 by the pump 817. Generally, the plating solution flows upwards through an anode membrane 815 and a diffuser plate 819 to the center of wafer 807 and then radially outward and across wafer 807. The plating solution also may be provided into anodic region of the bath from the side of the plating bath 803. The plating solution then overflows plating bath 803 to an overflow reservoir 821. The plating solution is then filtered (not shown) and returned to pump 817 completing the recirculation of the plating solution. In certain configurations of the plating cell, a distinct electrolyte is circulated through the portion of the plating cell in which the anode is contained while mixing with the main plating solution is prevented using sparingly permeable membranes or ion selective membranes.

A reference electrode 831 is located on the outside of the plating bath 803 in a separate chamber 833, which chamber is replenished by overflow from the main plating bath 803. Alternatively, in some of the preferred embodiments the reference electrode is positioned as close to the substrate surface as possible, and the reference electrode chamber is connected via a capillary tube or by another method, to the side of the wafer substrate or directly under the wafer substrate. In some of the preferred embodiments, the apparatus further includes contact sense leads that connect to the wafer periphery and which are configured to sense the potential of the metal seed layer at the periphery of the wafer but do not carry any current to the wafer.

A reference electrode 831 is typically employed when electroplating at a controlled potential is desired. The reference electrode 831 may be one of a variety of commonly used types such as mercury/mercury sulfate, silver chloride, saturated calomel, or copper metal. A contact sense lead in direct contact with the wafer 807 may be used in some embodiments, in addition to the reference electrode, for more accurate potential measurement (not shown).

A DC power supply 835 can be used to control current flow to the wafer 807. The power supply 835 has a negative output lead 839 electrically connected to wafer 807 through one or more slip rings, brushes and contacts (not shown). The positive output lead 841 of power supply 835 is electrically connected to an anode 813 located in plating bath 803. The power supply 835, a reference electrode 831, and a contact sense lead (not shown) can be connected to a system controller 847, which allows, among other functions, modulation of current and potential provided to the elements of electroplating cell. For example, the controller may allow electroplating in potential-controlled and current-controlled regimes. The controller may include program instructions specifying current and voltage levels that need to be applied to various elements of the plating cell, as well as times at which these levels need to be changed. For example, it may include program instructions for maintaining the potential of the substrate within certain boundaries, such as below the critical potential of the DSI additive, but within about 150 mV of this critical potential.

When forward current is applied, the power supply 835 biases the wafer 807 to have a negative potential relative to anode 813. This causes an electrical current to flow from anode 813 to the wafer 807, and an electrochemical reduction (e.g. $Cu^{2+}+2\ e^-=Cu^0$) occurs on the wafer surface (the cathode), which results in the deposition of the electrically conductive layer (e.g. copper) on the surfaces of the wafer. An inert anode 814 may be installed below the wafer 807 within the plating bath 803 and separated from the wafer region by the membrane 815.

The apparatus may also include a heater 845 for maintaining the temperature of the plating solution at a specific level. The plating solution may be used to transfer the heat to the other elements of the plating bath. For example, when a wafer 807 is loaded into the plating bath the heater 845 and the pump 817 may be turned on to circulate the plating solution through the electroplating apparatus 801, until the temperature throughout the apparatus becomes substantially uniform. In one embodiment the heater is connected to the system controller 847. The system controller 847 may be connected to a thermocouple to receive feedback of the plating solution temperature within the electroplating apparatus and determine the need for additional heating.

The controller will typically include one or more memory devices and one or more processors. The processor may include a CPU or computer, analog and/or digital input/output connections, stepper motor controller boards, etc.

In certain embodiments, the controller controls all of the activities of the electroplating apparatus. The system controller executes system control software including sets of instructions for controlling one or more of substrate rotation speed, composition of electrolyte, biasing of the substrate under controlled potential or under controlled current, temperature of electrolyte, etc.

For example, the controller may include instructions for performing electroplating in accordance with any method described above or in the appended claims. Non-transitory machine-readable media containing instructions for controlling process operations in accordance with the present invention may be coupled to the system controller.

Typically there will be a user interface associated with controller 847. The user interface may include a display screen, graphical software displays of the apparatus and/or process conditions, and user input devices such as pointing devices, keyboards, touch screens, microphones, etc.

The computer program code for controlling electroplating processes can be written in any conventional computer readable programming language: for example, assembly language, C, C++, Pascal, Fortran or others. Compiled object code or script is executed by the processor to perform the tasks identified in the program.

The controller parameters relate to process conditions such as, for example, electrolyte composition and flow rates, temperature, potential to be applied, current waveforms, etc. These parameters are provided to the user in the form of a recipe, and may be entered utilizing the user interface.

Signals for monitoring the process may be provided by analog and/or digital input connections of the system controller. For example, potential measured by the reference electrode and, optionally, the contact sense lead, may be input to the controller and used for controlling applied potential during plating. Further, system current may be measured, and input into the controller for plating endpoint detection. The signals for controlling the process can be output on the analog and digital output connections of the deposition apparatus.

The system software may be designed or configured in many different ways. For example, various apparatus component subroutines or control objects may be written to control operation of the chamber components necessary to carry out the inventive deposition processes. Examples of programs or sections of programs for this purpose include potential control code, current control code, substrate rotation control code, etc.

In some embodiments the methods described herein will be implemented in a system which comprises an electroplating apparatus and a stepper.

Pre-Wetting Chamber

Figure 9:
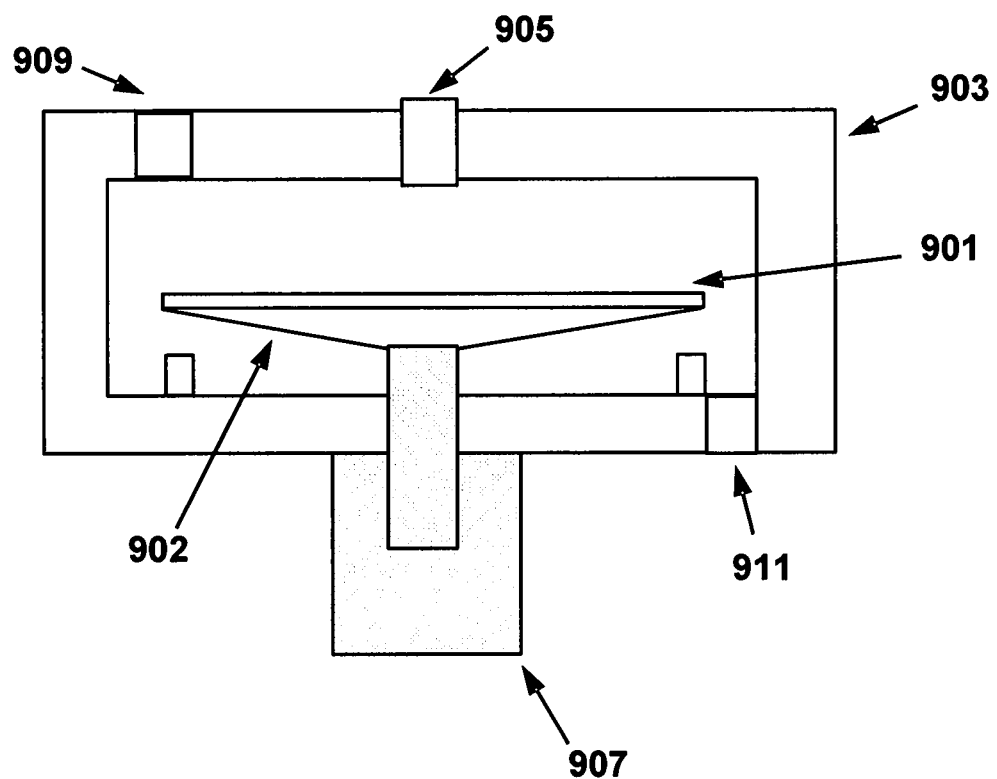
FIG. 9 is a simplified schematic presentation of a pre-wetting chamber suitable for pre-wetting TSVs prior to electrofilling in accordance with an embodiment presented herein.

In some embodiments, the substrate is pre-wetted in a pre-wetting chamber prior to electroplating, such that entrapment of bubbles in the recessed features is avoided. One embodiment of a pre-wetting chamber is shown in FIG. 9. In this embodiment, the pre-wetting chamber is configured for delivering the pre-wetting fluid onto the wafer substrate in a liquid form. The pre-wetting chamber may also be configured for spraying or streaming the pre-wetting fluid onto the wafer substrate for a period of time. In FIG. 9, a wafer 901 is held face-up in pre-wetting chamber 903 with wafer holder 902. In some embodiments, the wafer holder is configured to hold the wafer substrate in substantially a horizontal orientation during the pre-wetting process. In other embodiments, the wafer holder is configured to hold the wafer substrate in substantially a vertical orientation during the pre-wetting process.

In a typical operation, vacuum is first pulled on chamber 903 though vacuum port 909, which is connected to a vacuum system (not shown). This reduces the pressure in the chamber to a subatmospheric pressure. After much of the gas in the chamber is removed by the vacuum, pre-wetting fluid is delivered onto the wafer surface from the nozzle 905 or other mechanism. In some embodiments, the pre-wetting fluid is degassed prior to contacting the wafer surface, again, to avoid gas being released as the pre-wetting fluid enters the vacuum environment. The wafer may be rotated with motor 907 during the pre-wetting fluid delivery process to insure complete wetting and exposure of the wafer. In some embodiments, the pre-wetting chamber is configured to deliver the pre-wetting fluid onto the wafer substrate. In some embodiment, the pre-wetting fluid is liquid. In some embodiment, the pre-wetting fluid (a liquid) first contacts the rotating wafer substrate within about 3 cm of the center of the wafer substrate. After pre-wetting, the wafer is spun at a low rotation rate with motor 907 to remove entrained pre-wetting fluid, but leaving a thin layer of fluid on the wafer surface. Excess pre-wetting fluid is drained and exits the vacuum chamber through port 911. The wafer is then transferred to the plating cell such as a Novellus clamshell cell for plating with a thin layer of pre-wetting fluid retained by surface tension on its surface and within its features. The pre-wetting chamber will also typically include a controller (not shown) comprising program instructions for performing various aspects of the pre-wetting process described herein.

In some embodiments, the pre-wetting chamber and the electroplating chamber are included in one module, which may include a controller with program instructions for transferring the substrate from the pre-wetting chamber to the electroplating chamber, after the pre-wetting has been completed.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method of electrochemically filling large high aspect ratio recessed features with metal without depositing a thick layer of metal on a field region of a substrate, the method comprising:
   (a) providing a substrate having a large high aspect ratio recessed feature to an electroplating apparatus, wherein the recessed feature has a diameter or width of at least about 1 μm and an aspect ratio of at least about 5:1, and;
   (b) electroplating metal in the recessed feature by contacting the substrate with an electroplating solution comprising (i) metal ions; and (ii) an organic dual-state inhibitor (DSI) configured for inhibiting metal deposition in the field region, while electrically biasing the substrate under potential-controlled conditions to electroplate metal, wherein electroplating metal under potential-controlled conditions comprises electroplating below a critical potential of the DSI, wherein the DSI is characterized by a cyclic voltammogram having an inflection point between a first region exhibiting minimal current change with potential change and a second region exhibiting a large current change with potential change, the inflection point corresponding to the critical potential wherein after filling the feature, the ratio of the metal layer thickness deposited on the field to the metal layer thickness deposited in the feature is not greater than about 0.05.

2. The method of claim 1, wherein the metal is copper.

3. The method of claim 1, wherein the recessed feature is a through silicon via (TSV).

4. The method of claim 1, wherein the recessed feature has an aspect ratio of at least about 15:1.

5. The method of claim 1, wherein electrically biasing the substrate under potential-controlled conditions comprises directly controlling the potential, such that it does not exceed the critical potential of the dual state inhibitor for selected plating conditions.

6. The method of claim 1, wherein the potential is controlled using a reference electrode positioned in the proximity of the substrate.

7. The method of claim 1, wherein the potential is controlled using a reference electrode positioned in the proximity of the substrate, wherein the reference electrode is an unpolarized metal electrode comprising the same metal that is being electroplated.

8. The method of claim 1, wherein the potential is controlled using a reference electrode positioned in the proximity of the substrate, wherein the reference electrode is immersed into a solution that is substantially free of the DSI additive.

9. The method of claim 1, wherein the dual-state inhibitor suppresses the current in the field region to less than about 2 mA/cm$^2$.

10. The method of claim 1, wherein the critical potential of the dual-state inhibitor is at least about −0.15 V versus the open circuit potential.

11. The method of claim 1, wherein at about the critical potential the current increases at least 0.1 mA/cm$^2$ per 1 mV.

12. The method of claim 1, wherein the electroplating solution comprises copper ions at a concentration of at least about 40 g/L.

13. The method of claim 1, wherein the electroplating solution further comprises sulfuric and/or methanesulfonic acid at a concentration of at least about 40 g/L.

14. The method of claim 1, wherein the electroplating solution further comprises an electroplating accelerator, selected from the group consisting of 3-mercapto-1-propanesulfonic acid, bis-(3-sodiumsulfopropyldisulfide) (SPS), and N,N-dimethyl-dithiocarbamyl propylsulfonate (DPS).

15. The method of claim 1, wherein the electroplating solution further comprises an electroplating suppressor, selected from the group consisting of polyethylene glycol (PEG) and polyethyleneoxide (PEO).

16. The method of claim 1, wherein the DSI compound is a quarternary ammonium salt, which has at least one alkyl or aralkyl substituent with at least 7 carbon atoms.

17. The method of claim 1, wherein the DSI compound is selected from the group consisting of a benzalkonium salt, a thonzonium salt, a dodecyltrimethylammonium salt, and benzyldimethylhexadecylammonium chloride (BDHAC).

18. The method of claim 1, wherein the plating is performed at a temperature range of between about 20 and 60 degrees C.

19. The method of claim 1, further comprising determining plating endpoint by the current response from the substrate.

20. The method of claim 1, wherein the substrate is electrically biased within about 1 second after it is contacted with the plating solution.

21. The method of claim 1, wherein the substrate is rotated at between about 5-120 rpm during electroplating.

22. The method of claim 1, further comprising rotating the substrate during electroplating, and reducing the rotation rate of the substrate during electroplating.

23. The method of claim 1, wherein the electroplating under potential-controlled conditions comprises: (i) determining a current waveform imposed on a plating cell that creates an equivalent to potential-controlled conditions, and (ii) applying said current waveform to the substrate during electroplating.

24. The method of claim 1, wherein the electroplating solution is substantially free of chloride.

25. The method of claim 1, wherein the electroplating solution comprises more than one DSI compound.

26. The method of claim 1, further comprising the steps of:
applying photoresist to the substrate;
exposing the photoresist to light;
patterning the resist and transferring the pattern to the substrate;
and selectively removing the photoresist from the substrate.

27. The method of claim 26, wherein said patterning is performed to define large recessed features on the substrate prior to electroplating.

28. The method of claim 1, wherein the DSI is characterized by its ability to inhibit electrodeposition of metal when the critical potential is not exceeded, and its inability to inhibit electrodeposition after the critical potential is exceeded.

29. The method of claim 1, wherein the DSI is characterized by a cyclic voltammogram exhibiting a hysteresis, such that current at the critical potential in a reverse potential sweep is greater than the current at the critical potential in a forward potential sweep.

* * * * *